US006792259B1

(12) United States Patent
Parise

(10) Patent No.: US 6,792,259 B1
(45) Date of Patent: *Sep. 14, 2004

(54) REMOTE POWER COMMUNICATION SYSTEM AND METHOD THEREOF

(76) Inventor: Ronald J. Parise, 101 Wendover Rd., Suffield, CT (US) 06078

( * ) Notice: Subject to any disclaimer, the term of this patent is extended or adjusted under 35 U.S.C. 154(b) by 354 days.

This patent is subject to a terminal disclaimer.

(21) Appl. No.: 09/648,951

(22) Filed: Aug. 25, 2000

Related U.S. Application Data

(63) Continuation-in-part of application No. 09/436,291, filed on Nov. 8, 1999, now Pat. No. 6,114,834, which is a continuation of application No. 08/934,270, filed on Sep. 19, 1997, now Pat. No. 5,982,139.
(60) Provisional application No. 60/046,027, filed on May 9, 1997.

(51) Int. Cl.[7] .................................................. H04Q 7/20
(52) U.S. Cl. ............................... 455/343.1; 455/127.1; 320/109
(58) Field of Search .......................... 455/343.1, 127.1; 320/101, 104, 109, 108, 106; 340/333; 361/235; 701/22; 180/2.1, 313

(56) References Cited

U.S. PATENT DOCUMENTS 3,781,647 A * 12/1973 Glaser .......................... 322/2 R
3,971,454 A * 7/1976 Waterbury ................... 180/65.8
5,503,350 A * 4/1996 Foote ........................... 244/1 R
5,573,090 A * 11/1996 Ross .............................. 191/10
5,990,828 A * 11/1999 King ............................ 342/359
6,114,834 A * 9/2000 Parise .......................... 320/109

* cited by examiner

Primary Examiner—Jean Gelin
(74) Attorney, Agent, or Firm—Alix, Yale & Ristas, LLP

(57) ABSTRACT

A power system and method for communicating power to a power receiver employing wireless energy transmission. The power system includes a power transmission unit, which transmits energy as a directional power beam, and a power receiver system which receives the transmitted energy. The power receiver system is preferably incorporated in a surface vehicle and includes a receptor capable of receiving a wireless energy beam and transferring the electrical energy to the storage device. The power receiver system further includes a translocator for transmitting a communication signal to the power transmission unit corresponding to the location of the power receiver system and thereby activating the power transmission unit. The power transmission unit receives and locks onto the signal and preferably tracks the power receiver system location during energy transmission. The communication signal is transmitted until the energy is no longer needed by the power receiver system.

48 Claims, 24 Drawing Sheets

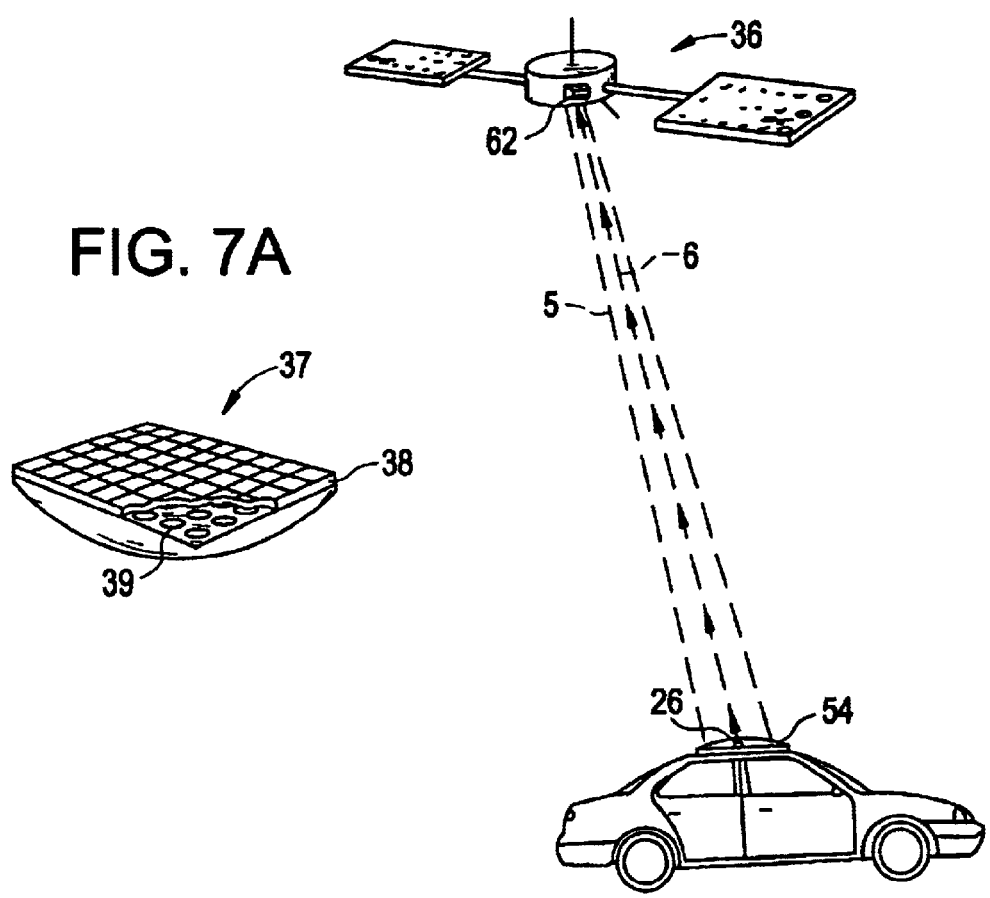

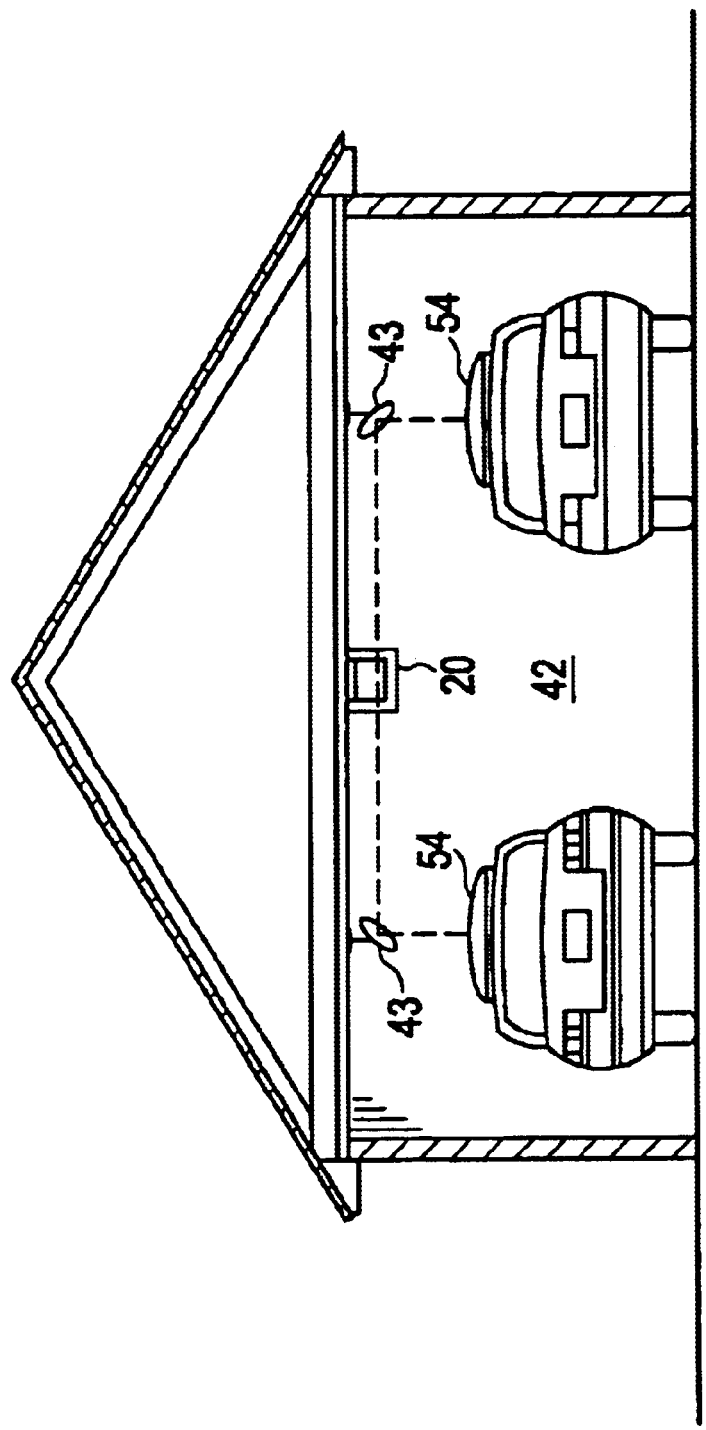

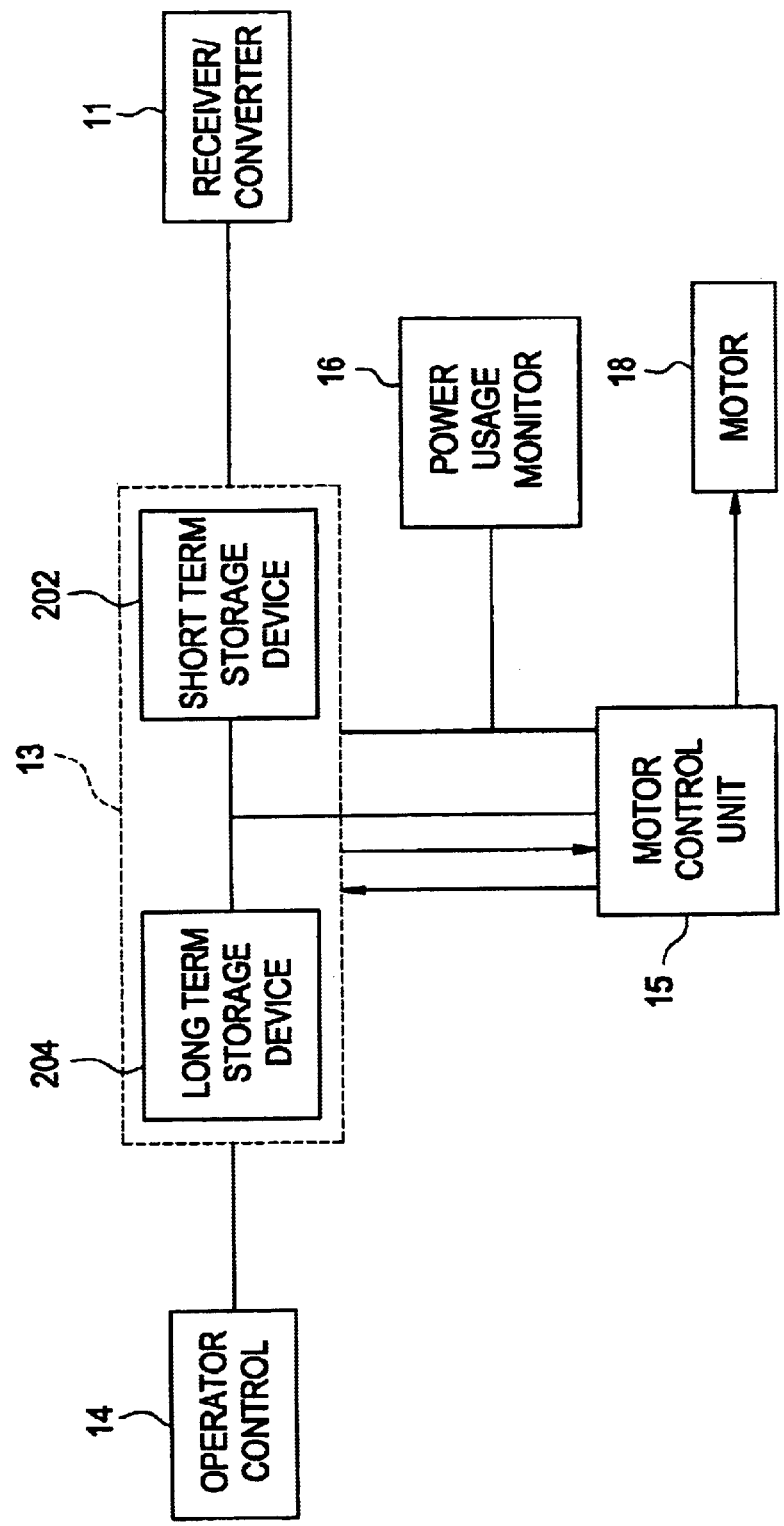

REMOTE POWER COMMUNICATION SYSTEM AND METHOD THEREOF

CROSS-REFERENCE TO RELATED APPLICATION

This is a continuation-in-part application of U.S. patent application Ser. No. 09/436,291, filed Nov. 8, 1999, now U.S. Pat. No. 6,114,834, which is a continuation of U.S. patent application Ser. No. 08/934,270, filed Sep. 19, 1997, now U.S. Pat. No. 5,982,139, which claims the benefit of U.S. Provisional Application No. 60/046,027, filed May 9, 1997.

BACKGROUND OF THE INVENTION

The present invention relates in general to a wireless power transmission system. One particular aspect of the present invention relates to a remote power transmission system for vehicles.

There have been numerous attempts and initiatives established for next generation land based vehicles. Federal and local governments have placed limits on emissions as well as set standards for fuel consumption. Some programs have set goals for vehicle mileage of 80 miles per gallon and greatly reduced vehicle emissions based on today's standards. Even with recapture of regenerative braking energy, a hybrid electric/internal combustion vehicle will be hard pressed to meet these goals.

One of the major causes of smog today is the use of city buses for public transportation. Diesel and gasoline driven buses spew out tons of pollutants daily. Utilization of buses powered by electricity would eliminate this source of pollution from our cities. To date, the most reliable electric source has been overhead tethered line or on-ground tracks. But these greatly reduce the convenience of route changes and are at the mercy of small traffic pattern changes which can cause traffic tie-ups. The ideal electric bus would have a completely mobile energy source, such as a battery pack. But the limited range of a battery-powered vehicle has diminished public acceptance of such vehicles.

In large cities a single battery pack, consisting of several standard 12- or 24-volt batteries, provides power only for driving an all-electric bus one or two route cycles. The vehicle must then be pulled out of service for either an expensive battery pack replacement to allow the discharged battery unit time to be recharged while the vehicle is put back in service immediately with a fresh battery pack; or the vehicle must be taken completely out of service while the battery unit is being charged on the vehicle. Recharging the battery pack can be a four-or five-hour process. Therefore an all-electric, completely mobile city bus service is cumbersome to run and maintain, difficult to keep on schedule and expensive to operate.

Originally, a wireless power transmission system was proposed to augment the existing system of electrical conductors that are used to move large quantities of electrical power over long distances. Later, systems were proposed to convert large quantities of solar energy into an energy beam that could be transmitted from outer space to the surface of the earth through satellite transmissions. Once on earth the energy beam would be converted back to a usable energy form that would be pumped into the existing electrical energy distribution grid.

See for instance U.S. Pat. Nos. 3,114,517; 3,781,647; and 3,174,705. Several transmission frequencies of the energy spectrum have been considered to minimize the energy loss from the beam as it travels through the atmosphere, including radio frequency (RF), laser, and optical frequency (OF). For the RF energy beam, atmospheric attenuation is a minimum up to 4 GHz even during a heavy rainstorm. Other windows of transmission exist at 35 GHz and 94 GHz. Systems designed to operate at these relatively high frequencies have the added advantage of operating at smaller apertures wherein the transmitting antenna and the receiving antenna can be smaller. Such systems have been considered for transmission of energy from satellites in a low earth orbit or geosynchronous orbit to the surface of the earth, a distance of many kilometers. Transmitting from space to the surface of the earth greatly diminishes laser based energy beam capabilities due to the long distances the laser beam must travel in the earth's atmosphere.

A wireless remote system capable of transmitting energy distances of 100 to 500 meters is needed. At these relatively short distances, even taking into account additional power requirements for attenuation in the earth's atmosphere, many more RF bands become available. Energy transmission via a laser beam also becomes viable.

Laser energy beam transmission has the additional advantage of requiring relatively small transmitting and receiving antennae.

SUMMARY OF THE INVENTION

Briefly stated, the invention in simplified form comprises a power transmission unit and a power receiver system. In some embodiments there are a plurality of power transmission units, each interconnected to a power source such as, for instance, the existing electrical power transmission grid. Each power transmission unit or "PTU" includes a power transmitter selectively activatable between the on and off condition. In the on condition, the power transmitter transforms energy from the power source into a directionally transmitted wireless power beam. The power transmission unit also preferably comprises a communication device for receiving a communication signal and a power unit controller operably connected to both the communication device and power transmitter. The power unit controller device is preferably a logic type device incorporating microprocessors and functions to control the overall operation of the power transmission unit. In other embodiments the power transmission unit includes safety devices, signal locating and tracking capabilities as well as a device or devices to change the focus and/or orientation of the directional power beam transmitted by the power transmitter.

The power receiver system is preferably comprised of a number of operably interconnected components. The power receiver system will include an energy receptor, such as an antenna, receptor/converter or combination receiver/antenna (rectenna). The energy receptor receives the power beam transmitted from the power transmitter. Each system will also comprise an energy converter, which converts the energy received by the receptor to a form capable of storage in an energy storage device. A power usage monitor monitors the energy level in the energy storage device and preferably the energy being expended and energy being received by the energy receiving means. A transmitter/locator or "translocator" is operably connected to the power usage monitor. The translocator functions to transmit a translocator signal from a translocator antenna.

In some embodiments the power receiver system is incorporated into a vehicle. It should be understood that the term "vehicle" is meant to encompass any and all vehicle types unless specifically limited. A surface vehicle may similarly be of any type for use on or near any surface such as, for example, boats, cars, trucks, golf carts, hovercraft or amusement park rides. Each vehicle would have many of the attributes of presently existing vehicles. Passenger cars for instance would typically include well known provisions for steering, speed control, suspension, braking, heating, ventilation and air-conditioning, etc. The motor for the vehicle could be any type which is able to utilize the energy received and/or stored by the vehicle, as later described.

In use of a preferred form of the invention, the vehicle would travel along existing routes; cars for instance would travel along existing roads. Each vehicle is independent, relying on its own motor for motive power and powering the motor with energy received from the power transmitter or from the energy storage device contained on board the vehicle. The power usage monitor constantly checks the amount of energy contained within the energy storage device as well as the amount and rate at which energy is being withdrawn from the energy storage device. When the level of energy in the energy storage device falls below a predetermined level, the power usage monitor activates the translocator to start transmission of a vehicle communication signal.

The vehicle communication signal is received by a power unit controller via the power unit communication device. The power unit controller "interprets" the vehicle communication signal as a request for power transmission and locates the source of the vehicle communication signal, which is, of course, the location of the vehicle, or more preferably, the location of the vehicle energy receptor. Once the vehicle energy receptor is located, the power unit controller orients the power transmitter and initiates broadcast of the directional power beam to the vehicle receptor. Naturally, if the vehicle is moving, the power transmission unit continues to track the vehicle location via the vehicle communication signal and adjust the power transmitter so that the directional power beam remains aligned with the vehicle energy receptor. When the vehicle has received sufficient energy, the translocator terminates the vehicle communication signal, causing the power unit controller to cease power beam transmission from the power transmitter.

In some embodiments the power usage monitor tracks the energy received by the energy receptor. This information may be part of the communication signal which is transmitted from the power receiver system to the power transmission unit. If the communication signal fails to acknowledge the receipt of power from the power beam, the power unit controller can actuate the power transmitter to the off condition, terminating transmission of the power beam. This acts as a fail-safe should the power beam be interrupted or should the power beam and energy receptor become misaligned. Given the short distance between the power transmission unit and energy receptor and the fact that the power beam and communication signal travel at the speed of light, communication between the power receiver system and power transmission unit is almost instantaneous and takes place before the energy receptor has moved any significant distance.

In another aspect of the invention the power beam comprises a series of pulses or energy packets, receipt of each or some number of which must be acknowledged by the power receiver system in a communication signal before the next pulse or pulses are transmitted by the power transmitter to the energy receptor.

In a further aspect of the invention the communication signal comprises a data stream transferring information to the power unit controller. In this way, each power receiver system may be uniquely identified so that a power transmission unit receiving multiple communication signals can locate and track an individual energy receptor.

In another embodiment the vehicle also includes a translocator energy unit operably connected to the power receiver system. The translocator energy unit is a logic device having a user determinable number of energy credits. The vehicle communication signal, as part of the data stream, may include the number of energy credits contained on the translocator energy unit. As a power transmission unit transmits the power beam to the vehicle, the energy credits are electronically exchanged for quantities of power transmitted. When the energy credits in the translocator energy unit are depleted the translocator signal is terminated and the power unit controller stops transmission of the power beam. No further power transmission will be received by that vehicle until the vehicle operator has replenished the energy credits contained in the translocator energy unit.

In a further embodiment the power transmission unit communication device may also comprise a transmitter and the translocator may comprise a receiver. In this manner, when the communication signal is received by the power transmission unit, a power unit communication signal can be returned to the translocator antenna, establishing two-way communication between the power transmission unit and the power receiver system. In this embodiment, transmission of the power beam is initiated only after the two way communication has been established.

An object of the invention is to provide a new and improved wireless power transmission system and method.

Another object of the invention is to provide a new and improved wireless power transmission system and method, which is especially suited for use in short range, urban environments.

A further object of the invention is to provide a system and method for receiving wireless energy and converting the received energy to a different form.

Still another object of the invention is to provide an energy safety system and method.

A still further object of the invention is to provide a hybrid energy storage device.

BRIEF DESCRIPTION OF THE DRAWINGS

Other objects and advantages of the invention will become apparent from the detailed description and the drawings, in which:

FIG. 7 is a graphical illustration of a satellite incorporating a power transmission unit according to one aspect of the present invention;

FIG. 7A is a perspective view in partial section of a combination antenna according to one aspect of the present invention;

FIG. 10 is a side view of an embodiment of a power transmission unit installed in a garage;

FIG. 24 is a schematic diagram of an embodiment of a hybrid energy storage system for a vehicle.

DETAILED DESCRIPTION OF THE PREFERRED EMBODIMENTS

The disclosures of U.S. patent application Ser. No. 09/436,921 filed Nov. 8, 1999, and U.S. patent application Ser. No. 08/934,270 filed Sep. 16, 1997, now U.S. Pat. No. 5,982,139, are incorporated by reference herein.

Figure 1:
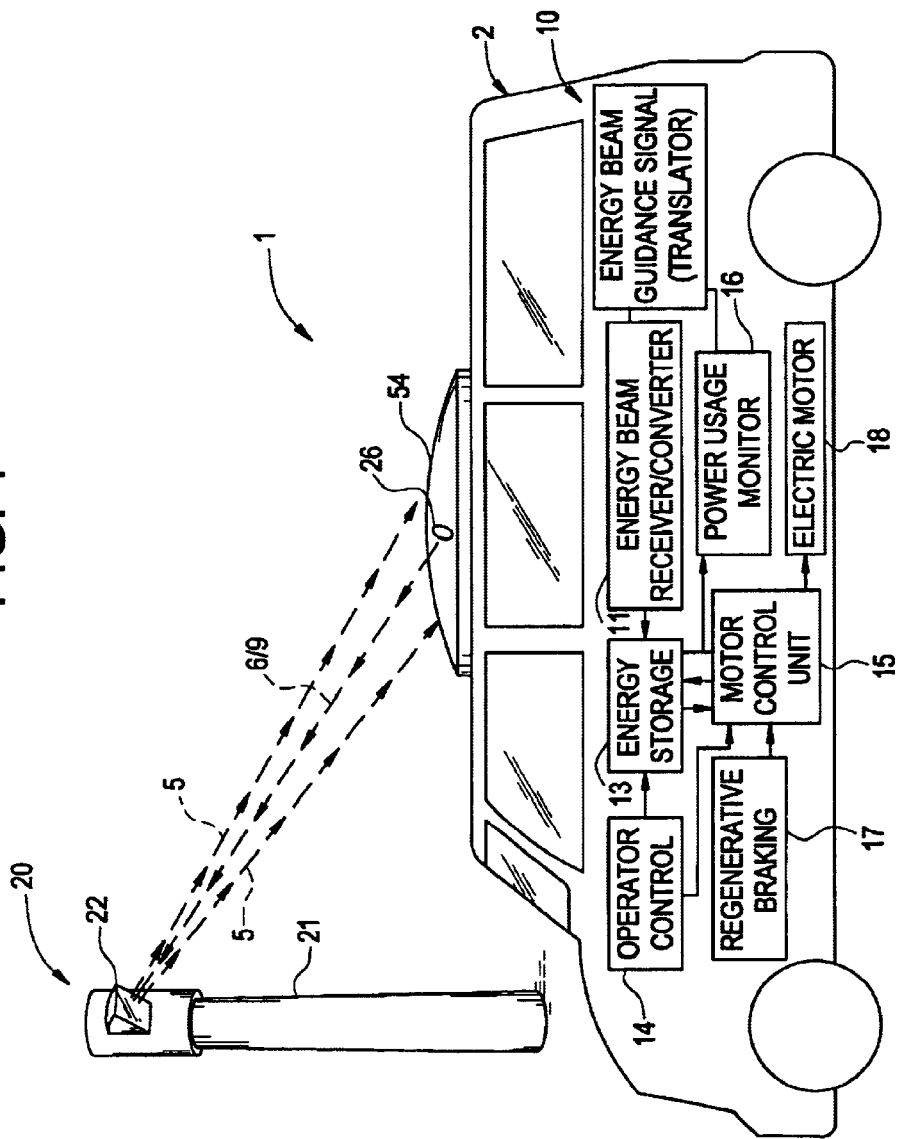
FIG. 1 is a schematic illustration of an electric vehicle incorporating an embodiment of the remote power system of the present invention.
Figure 11:
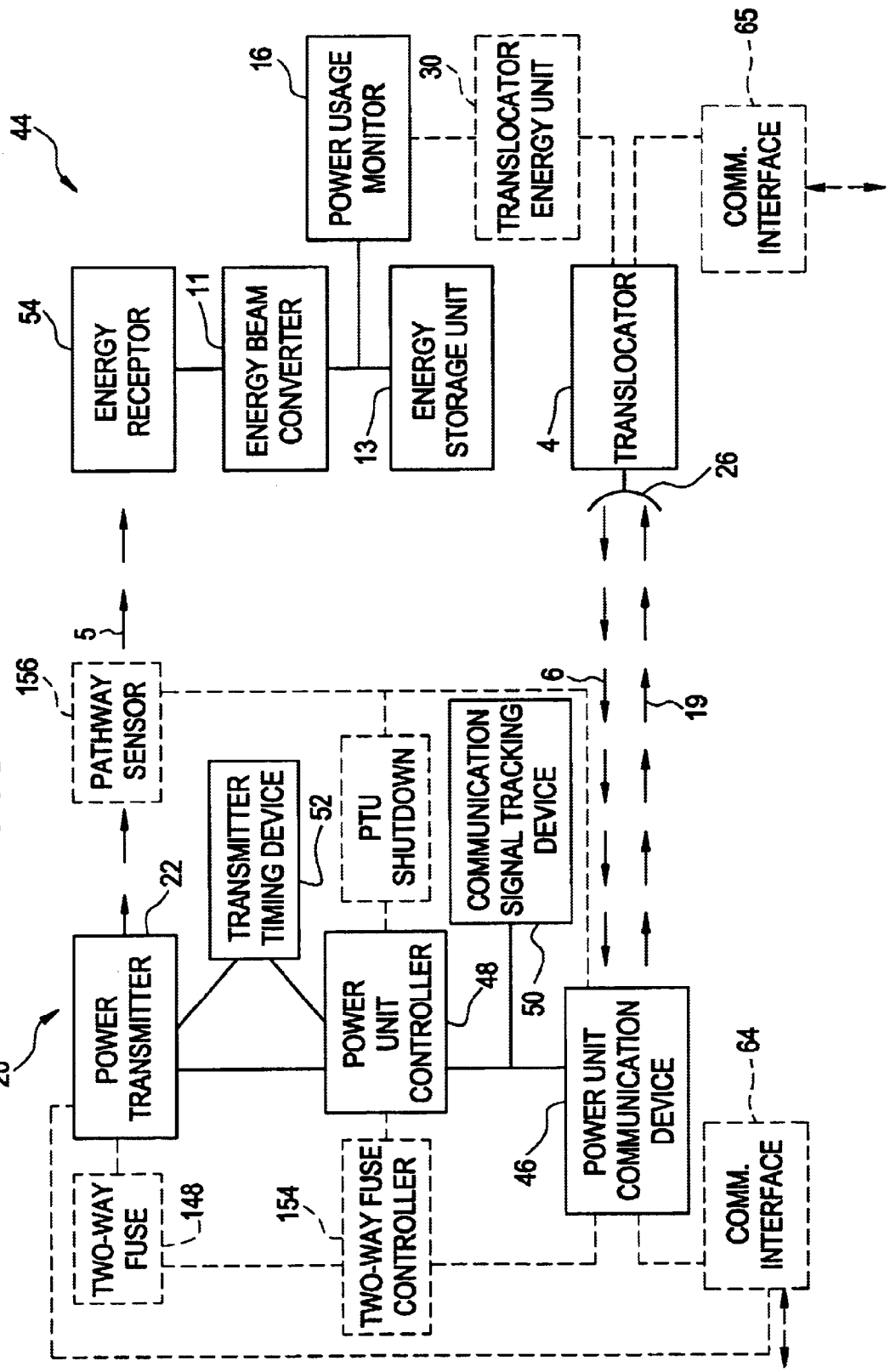
FIG. 11 is a schematic illustration of an embodiment of a remote power system.

With reference to the drawings wherein like numerals represent like components or structures throughout the figures, a remote power system of the invention is generally represented by the numeral 1. As schematically shown in FIG. 11, the remote power system comprises a power transmission unit or "PTU" 20 and a power receiver system 44. FIG. 1 shows one embodiment of the remote power system, comprising a power transmission unit 20 and an electric vehicle 2 incorporating the power receiving system.

In some embodiments the power transmission unit 20 is a stationary, ground-based unit electrically connected to a power source. Preferably, the power transmission unit 20 is connected to the existing electrical power transmission grid (not shown) and is mounted on utility poles 21, although the power transmission unit could also be mounted to other existing ground structure such as buildings, signs, etc. As shown in FIG. 11, the power transmission unit 20 comprises a power unit transmitter 22, a power unit controller 48, a power unit communication device 46. In some embodiments the power transmission unit includes a capability and structure for communication signal tracking and power unit transmitter aiming.

The power unit communication device 46 receives a communication signal 6 and activates the power unit controller 48 in response to receipt of the communication signal 6. The power unit controller 48 is a logic type device which verifies the received signal 6 is a request for power transmission. In some embodiments, the power unit controller 48 acknowledges the requestor's presence with a power unit communication signal 19 sent from the power unit communication device 46. The power unit controller 48 activates the power transmitter 22 to start transmission of a power beam 5 after verification. The power unit controller 48 will also deactivate the power transmitter 22 to turn off power beam 5 transmission.

The power transmitter 22 converts energy from the connected power source, electricity in the case of an existing power grid, to a directional wireless power beam 5. The conversion of energy to a directional power beam 5 is well known. For instance, power beams in microwave energy form may be created using a magnetron, a klystron or a traveling-wave tube. Power beams in laser energy form may be created by one of many known solid, liquid or gas laser systems.

In some embodiments, the power transmission unit 20 comprises a communication signal tracking unit 50 and a power transmitter-aiming unit 52. The signal-tracking unit 50 locks onto and follows the source of a moving communication signal 6. The aiming unit 52 cooperates with the tracking unit 50 and the power unit controller 48 to aim the power transmitter 22 at the source of the communication signal 6. The aiming unit 52 may also compensate for the distance between the power transmitter 22 and the source of the communication signal 6, varying the focus of the power beam 5 to maintain a desired power beam energy density at the vehicle communication signal source, typically located adjacent the energy receptor. The aiming unit 54 may also add dither, rotation or swagger to the energy beam for improved power distribution with certain types of energy receptors.

The power receiver system 44 comprises an energy receptor 54, an energy beam converter 11, an energy storage unit 13, a power usage monitor 16, a transmitter/locator or "translocator" unit 4 and a translocator antenna 26. Note that FIG. 1 schematically shows the translocator in block diagram form and also shows the preferred physical location in the energy receptor 54. It should be understood that any or all of the energy receptor, energy beam converter, and translocator and translocator antenna may be physically located together, such as, for example, in the energy receptor shown in FIG. 1. When the power receiver system is embodied in a surface vehicle, the vehicle will also preferably comprise an operator control 14, a motor control unit 15, a motor 18, and regenerative braking system 17 which are interrelated to the power receiver system 44.

The power usage monitor 16 is the main logic device for controlling power management inside and outside the vehicle. The power usage monitor 16 functions to monitor the amount of energy available to the vehicle from the onboard energy storage unit 13. Preferably, the power usage monitor 16 also monitors the energy used by the vehicle and the energy received from the power transmission unit 20. When the energy monitored falls below a predetermined level, the power usage monitor 16 activates the translocator unit 4.

The energy receptor 54 on the vehicle is preferably mounted so that it can swivel or move as needed to align with the power transmission unit 20 and maintain alignment as the vehicle moves. Movement of the energy receptor 54 maximizes the amount of energy that can be received by the power receiver system 44.

The activated translocator unit 4 initiates broadcast of a communication signal 6 from the translocator antenna 26. The translocator 4 will preferably have two modes of operation. The first is a general communication mode that essentially scans the horizon, either 360-degrees around the vehicle or some portion to either side of the vehicle direction, to search for a power transmission unit 20. If multiple power transmission units are detected, the power receiver system 44 selects the strongest signal candidates based on vehicle direction and speed, power transmission unit location, etc. Alternatively, the translocator antenna could remain oriented in a single direction during broadcast in the general communication mode.

Once a particular power transmission unit 20 was chosen, the translocator 4 changes from the general communication mode to a directional mode to provide a vehicle communication signal 6 with limited or controlled dispersion for the power transmitter 20 to follow. The power transmission unit 20 locates, locks onto and tracks the source of this communication signal beam 6. Since, as shown in FIG. 1, the vehicle communication signal 6 is preferably sent from a translocator antenna 26 coaxially located with the vehicle energy receptor 54, the tracking signal unit 50, thereby locks onto the location of the vehicle energy receptor 54. Once the power transmission unit 20 has located and locked onto the vehicle receptor 54, the power transmitter-aiming unit 52 adjusts the position of a power transmitter 22 to align with and focus on the vehicle receptor 54. Once aligned and focused, the power transmitter 22 initiates transmission of a directional power beam 5 to the vehicle receptor 54.

The power beam 5 is absorbed by the vehicle receptor 54 and transformed from the energy form used in the power beam 5 to a form compatible with the vehicle energy storage unit 13 by the energy beam converter 11. In the embodiment of FIG. 1, the energy storage unit 13 is a battery. Alternate energy storage devices such as, for example, flywheel, ultra-capacitor, fuel cell conversion of water to $H_2$, etc can also be used in appropriate vehicle systems. Energy stored in the energy storage unit 13 is used to power the various components onboard the electric vehicle 2. In conventional fashion, the operator control 14 allows the vehicle operator to control the motor through the motor control unit 15. The motor control unit 15 also controls the flow of energy from the regenerative braking system 17 contained in some embodiments to the energy storage unit 13. In a well known fashion, the regenerative braking system 17 converts the energy generated from slowing and stopping the vehicle into a form compatible with the energy storage unit 13 and transmits that energy through the motor control unit to either the electric motor 18 or the energy storage unit 13. The motor control unit 15 further functions as an interface between the operator control 14 and the motor 18, as well as providing energy consumption data to the power usage monitor 16.

When the level of energy in the energy storage unit 13 rises above a predetermined level, the power usage monitor 16 deactivates the translocator 4, terminating the vehicle communication signal 6. Upon loss of the vehicle communication signal 6, the power unit controller 48 deactivates the power transmitter 22, terminating transmission of the power beam 5 from the power transmission unit 20 to the energy receptor.

If the communication signal 6 is lost by the power transmission unit 20; or the power beam 5 or the power unit communication signal 19 is lost by the power receiver system, all communication between the power transmission unit 20 and power receiver system is considered lost, and the power unit controller 48 terminates power beam 5 transmission. A new communication link between the power transmitter unit and the power receiver system would have to be established before restart of power beam transmission.

In another aspect of the invention the power transmission unit sends a power unit communication signal to the power receiver system. This allows bidirectional or two-way communication links between the power transmission unit 20 and the power receiver system. In some embodiments the power beam 5 functions as the power unit communication signal.

As shown in FIG. 11, in other embodiments the power unit communication device 46 may comprise a transmitter and the vehicle translocator 4 may comprise a receiver. When the power transmission unit 20 receives a vehicle communication signal 6, a power unit communication signal 19 is returned to the vehicle translocator 4 via the antenna 26. Transmission of the power beam 5 is initiated only after the bidirectional communication link has been established. Note that once a communications link has been established between the power receiver system and the power transmission unit and power transmission has commenced, the power unit communication signal may be augmented and/or replaced by the power transmission beam.

The communication signal 6 preferably comprises a data stream. This allows the communication signal 6 to identify, for instance, a particular vehicle 56 to the power transmission unit 20, thereby allowing verification of the request prior to energy beam transmission. The use of a digital data stream also allows the vehicle 56 to transmit other information, such as, for example, amount of power received, vehicle location, vehicle speed and direction, etc. The use of a data stream allows for the transmission of a coded or encrypted communication signal, to provide a secure communication between the power receiver system and power transmission unit 20, preventing tampering with the signal or theft of power. Additionally, the use of a vehicle communication signal comprising a data stream would allow each vehicle communication signal to be assigned a priority. For instance, emergency vehicles could be given ultimate priority to preferentially receive any available power beams. Public transportation vehicles could be given a higher priority, to receive power beams before private vehicles, which would have the lowest priority. The use of the vehicle communication signal to transfer data to the power transmission unit 20 would also allow a stalled vehicle to be given a temporarily higher priority, allowing the stalled vehicle to be moved out of traffic.

Communication between the vehicle 56 and the power transmission unit 20 allows the vehicle 56 to be transferred from one power transmission unit to the next. As the vehicle travels, and the vehicle energy receptor 54 moves out of alignment or out of range of a first power transmission unit, the first unit will terminate transmission of the power beam to the vehicle. The vehicle can establish communication with the next closest power transmission unit and establish transmission of a power beam therefrom. In this manner, the vehicle can receive an almost constant supply of power from power transmission units along the vehicle route.

It should be recognized that the power beam and vehicle communication signal can be of an entirely different frequency range and/or signal type. Of course, the power beam 5 and the communication signals 6, 19 can be the same.

It should be further recognized that the remote power system 1 can use various power beam frequencies or energy forms at one time. The power beam can incorporate different energy forms simultaneously or sequentially depending on the design of the energy beam converter. This allows a power transmission unit 20 to use the energy form and frequency best adapted for the existing weather and/or atmospheric or other conditions at that time.

In another aspect of the invention the power unit communication signal 10 and/or the energy beam 5, once established, can be utilized to transfer an information signal between the power transmission unit and the vehicle. The information signal can include, for example, voice communications, data or other information. For example, the driver can receive calls and data from, for example, the Internet and/or be kept informed of local weather, road conditions, traffic information, etc. via the information signal between the power transmission unit and the vehicle.

In another embodiment, in addition to transfer of the information signal between the power transmission unit and the vehicle, the vehicle communication signal 6 can be utilized to transfer the information signal between the vehicle and the power transmission unit. For example, the driver can initiate and receive calls, contact the Internet and/or be kept informed of local weather, road conditions, traffic information, etc. via the information signal between the power transmission unit and the vehicle. Such communication and data transfer is especially useful in any embodiment where power transmission units are close together. In this situation a constant link with the vehicle can be maintained from power transmission unit to power transmission unit. This allows almost continuous communication between the vehicle and outside sources such as, for example, telephone calls or Internet access. This allows the vehicle driver and/or passengers to communicate with the outside world via the information communication signal transmitted by the power unit communication signal and/or energy beam and vehicle communication signal.

FIG. 11 shows one embodiment of the invention wherein there is a communication link between the vehicle and the outside world. In this embodiment a signal source is connected to the power transmission unit by a simple communication interface 64. The vehicle is equipped with a communication interface 65. In this way a continuous "hard" link or information signal between the vehicle and a signal source, for example the Internet, can be maintained. This communication link can be provided for any type of vehicle connected to the power transmission system. Line-of-sight communication would eliminate the typical "dead" spots that occur with existing cellular telephone and other present communication links that can be interrupted by buildings and other structures.

Figure 2:
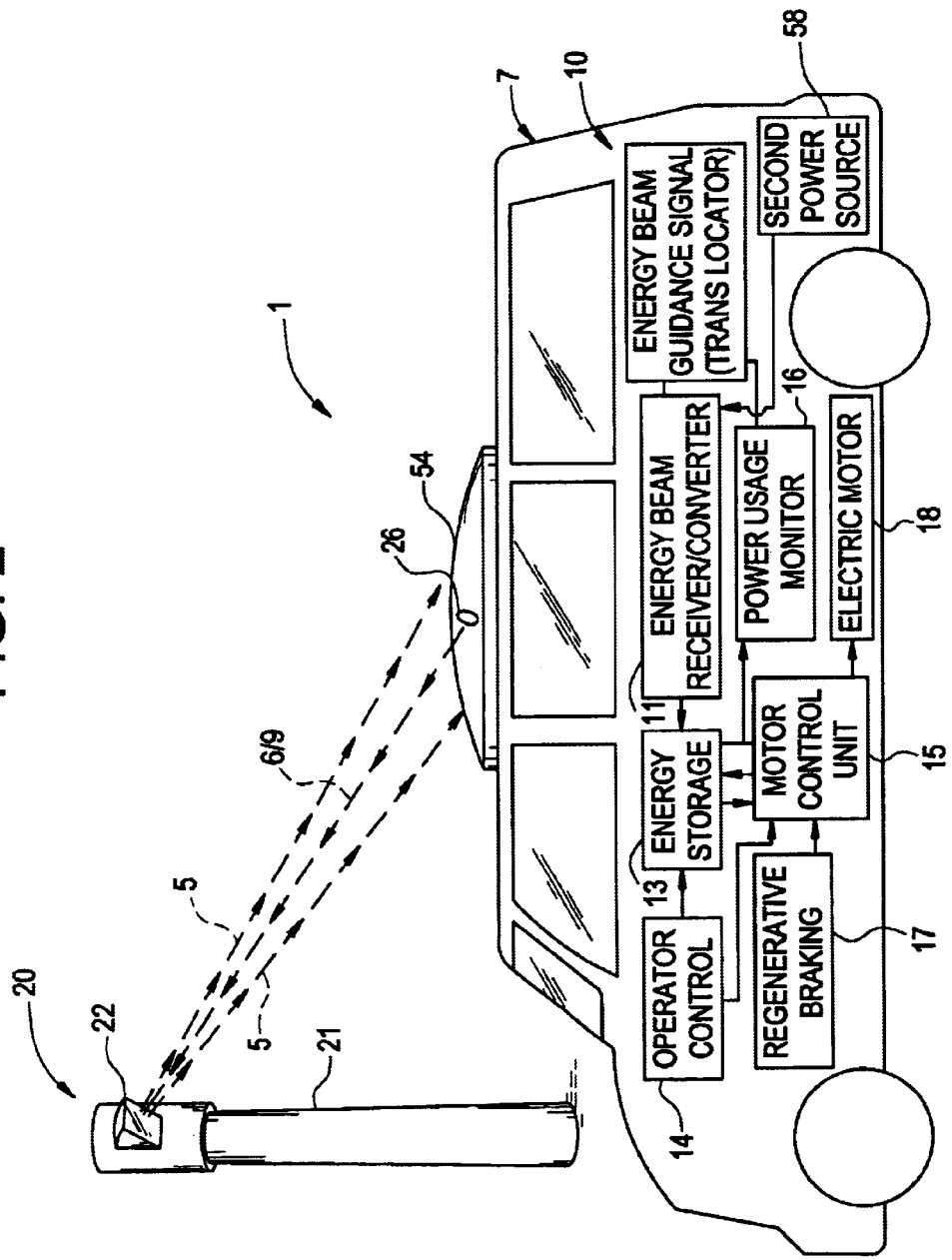
FIG. 2 is a schematic illustration of a hybrid vehicle incorporating an embodiment of the remote power system of the present invention.

Referring to FIG. 2, there is shown an embodiment of the present invention incorporated in a hybrid vehicle 7. The hybrid vehicle 7 includes a second power source 58 such as, for instance, an internal combustion engine or fuel cell. The hybrid vehicle 7 functions similar to the vehicle 56 described above except the inclusion of the second power source 58 allows the vehicle 7 to be operated in cases where a power transmission unit 20 is not encountered. When the power usage monitor 16 senses that the level of energy in the energy storage unit 13 is below a predetermined level, the second power source 58 is operated to generate energy which is in turn stored or used by the motor.

Another aspect of the invention is the use of a hybrid energy storage system. The hybrid energy storage system comprises a rapidly chargeable short term energy storage device and a more slowly chargeable long term energy storage device. One very distinct advantage to a hybrid energy storage system is the capability of storing a large quantity of energy very rapidly, then putting this large volume of rapid recharge energy into a long-term, more reliable storage media. For example, an ultracapacitor can store a very large amount of electrical energy in a very short time, but loses the full charge in a few days. The same is true for a flywheel. The flywheel may not be as quick to store energy as the capacitor, but similarly loses the stored energy in a few days. On the other hand, devices such as a storage battery or fuel cell can store energy for a very long period of time (months or even years), but requires a much longer time period to receive, absorb and store that energy.

Therefore, in an embodiment of the invention using a hybrid energy storage system a moving vehicle can drive past a power transmission unit for a few seconds and store a very large amount of energy in a rapid charge short term energy storage device, for example an ultracapacitor or flywheel. Then, as the vehicle continues down the road, this quick charged energy is transferred through a controller into a long-term storage device, for example a battery; i.e., the quick charge storage device provides a trickle charge for the battery. This will greatly improve the operation and effectiveness of the overall system.

In one embodiment, a quick charge storage device can supply energy through the motor control unit 15 directly to the drive motor if the driver needed a "burst "of energy to pass another vehicle. The quick charge storage device may both supply power to the drive motor and trickle charge the battery simultaneously. Alternately, the energy from the quick charge storage device can be slowly added to the battery or other storage system if passing power is not needed. In this way, once the vehicle is parked, the quick charge storage device can discharge to the long term storage device in a controlled, timely and efficient manner without fear of losing the energy stored in the quick charge storage device. FIG. 24 shows a schematic diagram of an embodiment of the hybrid storage scheme. The quick charge storage device 202 can be, for example, an ultracapacitor or flywheel, while the long-term device 204 can be, for example, a battery or fuel cell energy storage. The controller in this embodiment is part of the motor control unit 15. Power to the drive motor 18 can come from either the short-term energy storage unit or the longer-term energy unit, depending on the desired control scheme.

Figure 3:
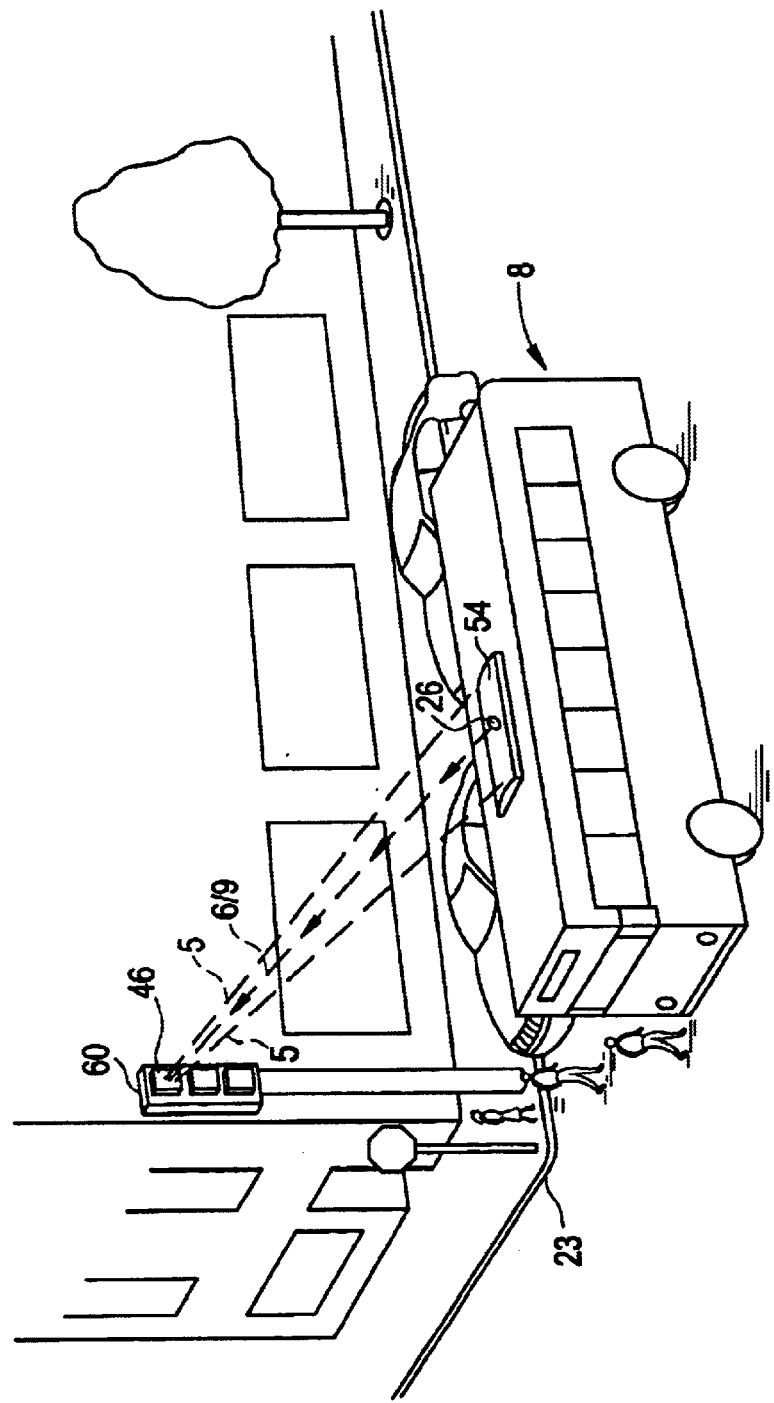
FIG. 3 is a perspective illustration of an embodiment of the present invention incorporated in an urban setting.

Referring to FIG. 3 there is shown a public transportation system utilizing an embodiment of the present invention. A bus 8 is shown stopped at a corner 23 of a typical city street, which includes power transmission unit 60. The bus includes an embodiment of the power receiver system 44 described above. While stopped for discharging and loading of passengers, the power usage monitor 16 (not shown in FIG. 3) activates the translocator 4 to transmit a vehicle communication signal 6 from the translocator antenna 26. The signal 6 is intercepted by the power transmission unit communication device 46, which signals the power unit controller to lock onto the source of vehicle communication signal 6 and initiate transmission of the power beam 5 from the power transmitter 22 to the bus receptor 54. In this typical operation there is no interruption of service to the bus 8 or passengers. The benefit over many prior art systems is also illustrated in FIG. 3. Because cars are parked at the curb there would be no possibility for a charging system mounted in the curb or roadbed, such as an induction system, to charge the storage unit of the bus. With the inventive remote power system 1 described, the storage unit of the bus 8 is charged by the power transmission unit 20 at any location within range of the power beam 5.

Figure 4:
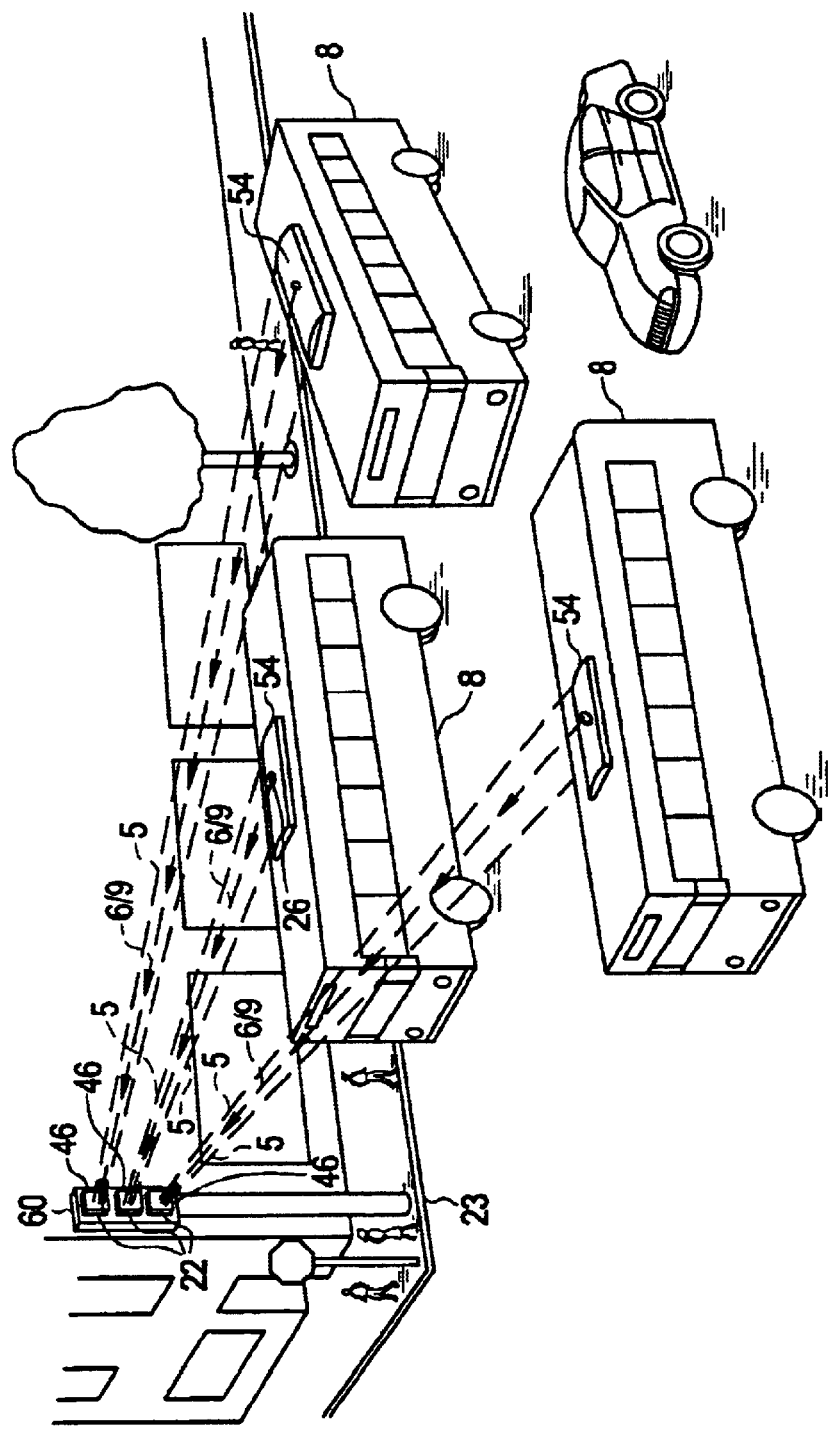
FIG. 4 is a perspective illustration of an embodiment of the present invention incorporated in an urban setting.

FIG. 4 shows three buses 8 located near the street corner 23.

In this embodiment all three buses are receiving energy in the form of separate power beams 5 while they are in the intersection. In this embodiment, the power transmission unit 60 comprises multiple power transmitters 22 and communication devices 46. It would also be possible for the remote power system 1 to sequentially transmit multiple power transmission beams 5 from a single power transmitter 22.

In another embodiment, the vehicle communication signal comprises a data stream including a code to identify the vehicle. The coded vehicle communication signal allows the power transmission unit to track a particular vehicle within traffic to minimize interferences and crossing of power beams. In addition, coded translocator signals allow user identification to power provider companies for billing purposes. In the setting shown in FIG. 4, any one of the three buses could change position with any of the other buses and there would be no difference as far as power beams 5 are concerned. The first bus 8 that arrives in range of the power transmission unit 60 has its vehicle communication signal 6 locked onto by one of the power transmitters 22. The second bus 8 that arrives in range of the power transmission unit 60 has its vehicle communication signal 6 locked onto by the next available power transmitter 22, and so on. A priority system can be set up so that the power transmitters 22 are activated in a particular order, and the order can be rotated so that each transmission unit 22 is utilized for the same amount of time. With the individual vehicle communication signals 6 coded, as the vehicles move the power transmitters 22 will not get confused and follow the wrong vehicle.

It is anticipated that a plurality of power transmission units can "hand off" vehicles from one power transmission unit to another. In this manner, a first power transmission unit ends power transmission to, and hands off the vehicle communication signal from, a first vehicle to a second power transmission unit. The second power transmission unit locks onto the vehicle communication signal and commences transmission of the power beam. It is also possible for power transmission units to "trade" or "swap" vehicle communication signals among each other. In any of these embodiments, the crossing of transmitted power beams, and the resulting destructive interference, are eliminated by the power transmission unit vehicle tracking capability.

Figure 5:
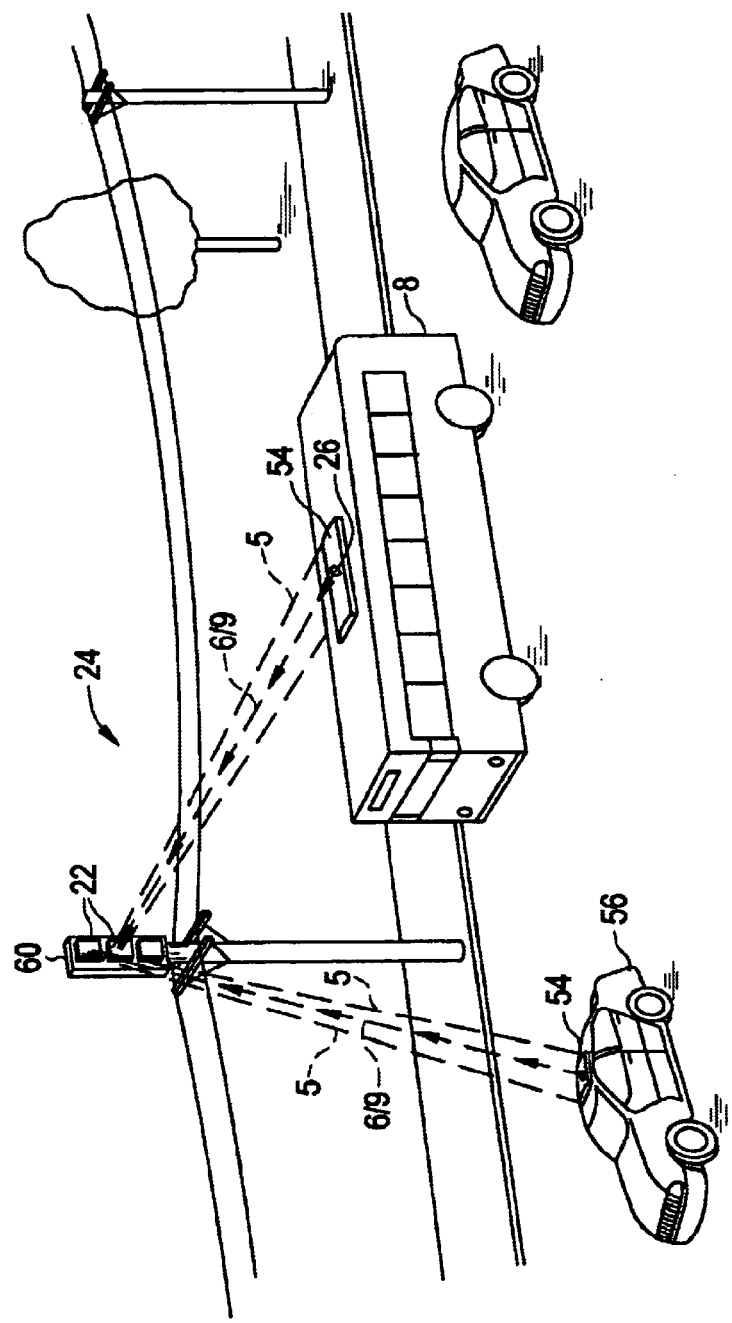
FIG. 5 is a perspective illustration of an embodiment of the present invention incorporated in a rural setting.

Referring to FIG. 5, there is shown a remote power system 1 of the present invention incorporated into a typical rural street setting 24. Both the car 56 and the bus 8 include a power receiver system 44. As the car and bus move along the road the power transmission unit 60 receives both vehicle communication signals 6. The power transmission unit 60 locks onto the source of each of the signals and starts transmission of a directional power beam 5 to receptors 54 on both the car 56 and bus 8. The power beam transmissions continue until a vehicle is either fully charged, or the vehicle travels beyond the range of the power transmission unit 60, at which time the communication signal will be halted.

Figure 6:
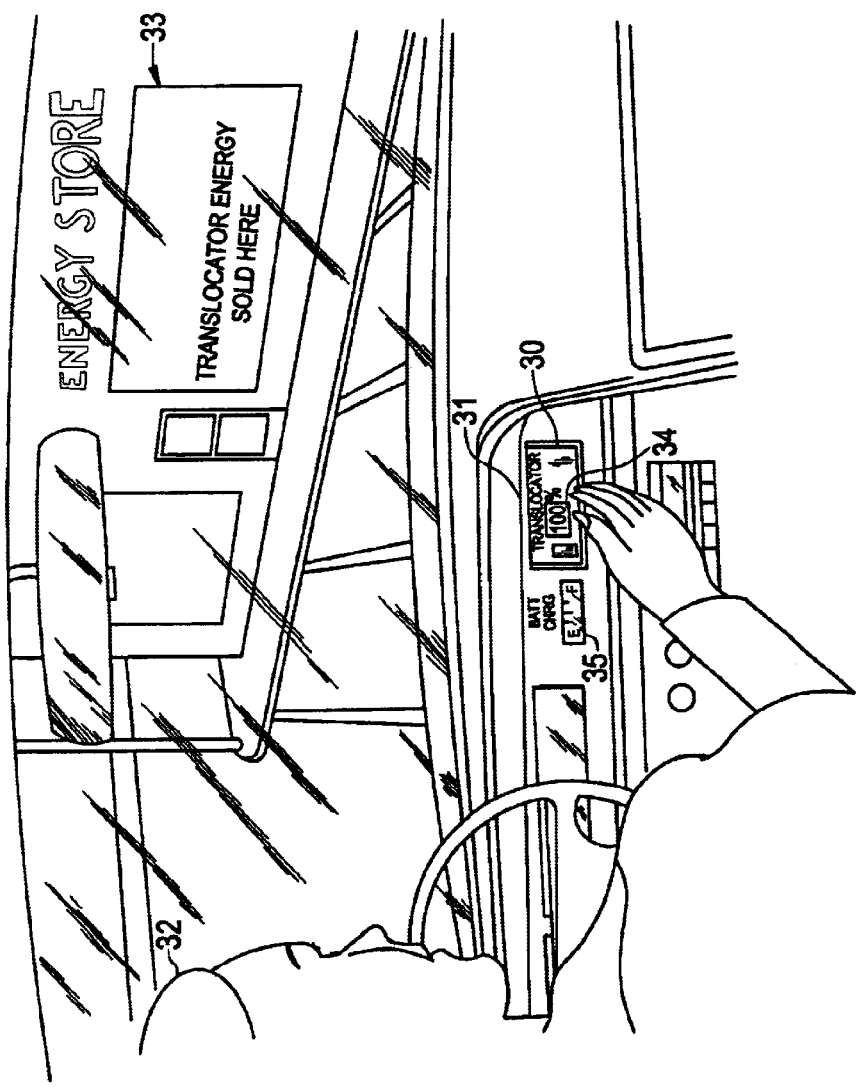
FIG. 6 is a perspective illustration of an embodiment of a translocator energy unit incorporated in a vehicle.

Shown in FIG. 6 is an embodiment of a translocator energy unit 30 of the present invention as incorporated in the dashboard 31 of a vehicle. The translocator energy unit 30 is a replenishable meter operably connected to the power usage monitor 16. The translocator energy unit 30 must contain energy credits for the translocator 4 to transmit a signal 6 to a power transmission unit 20 requesting a power beam 5. As the power receiver system receives energy from the power beam 5, a corresponding amount of energy credits are subtracted from the translocator energy unit 30. The vehicle operator 32 can replenish the empty translocator energy unit 30 as by, for instance, removing the unit 30 from the dashboard and delivering it to a consumer outlet 33. The operator 32 remits payment to the consumer outlet 33 corresponding to a certain amount of wireless energy. The consumer outlet 33 replenishes the translocator energy unit 30 to a level of energy credits corresponding to the amount of energy purchased. With the replenished translocator energy unit 30 reinstalled in the vehicle, the translocator 4 will transmit a vehicle communication signal 6 and the vehicle will receive a power beam 5 from any power transmission unit until the corresponding amount of energy in the translocator energy unit 30 is again exhausted. In some embodiments the translocator energy unit 30 also includes a metered readout 34 which corresponds to the level of energy units remaining in the unit 30. Also, shown in FIG. 6 is energy storage unit meter 35 which is a graphical readout corresponding to amount of energy remaining in the vehicle energy storage unit 13. By way of example, the amount of energy credit available in the translocator energy unit 30 could allow the vehicle to travel 400–500 miles, the equivalent of about one tank of gasoline in typical internal combustion powered passenger vehicle and many times the range of commercially available electric vehicles.

Referring to FIG. 7 there is shown a power transmission unit 62 located on satellite 36 for remote vehicle travel in rural parts of the country. In this embodiment, a vehicle incorporating a power receiver system 44 would have the mobility of an internal combustion engine vehicle, and the range (distance between translocator energy unit replenishment in vehicles so equipped) can be extended well beyond that of an internal combustion vehicle.

Figure 21:
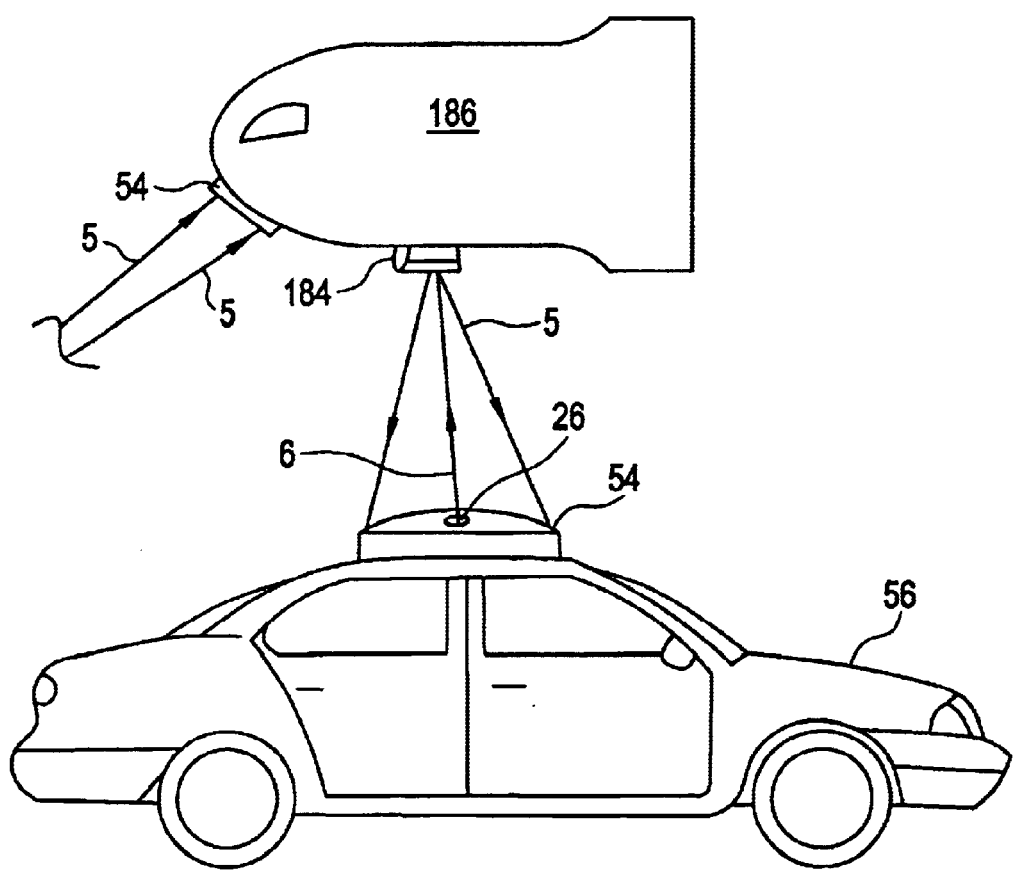
FIG. 21 is a schematic illustration of- an embodiment of the invention with an airborne power transmission unit.

FIG. 21 illustrates an embodiment of the remote power system 1 where the power transmission unit 184 is mounted to an airborne vehicle 186. As used herein, an airborne vehicle 186 comprises a balloon, blimp, dirigible, aircraft or other vehicle heavier or lighter than air and within the atmosphere. As previously described, the power transmission unit 184 receives a vehicle translocator signal 6 and transmits a wireless power beam 5 to the vehicle 56 originating the translocator signal 6. The airborne vehicle 186 can include a power receptor 54 and power receiver system 44, for receiving a wireless power beam 5. Energy received by the airborne vehicle 186 is then distributed to the vehicle 56 below.

Since the power beam 5 may comprise a number of different energy forms, the vehicle receptor 54 and energy beam converter 11 are capable of variation to best utilize the chosen power beam energy form. For example, the receptor 54 could be a large surface area design similar to FIGS. 1 and 2 with the power beam 5 focused over substantially the entirety of the receptor area, lowering the energy density of the power beam. Of course, the distance between the power transmitter 22 and the receptor 54 will affect the focus of the beam 5 or how much it "spreads", and therefore the resulting beam energy density at the vehicle receptor 54. The beam focus and therefore the energy density will change as the vehicle 56 approaches toward, and then departs from the power transmitter 22. This change in the focus of the power beam 5 can easily be accounted for and corrected by the transmitter-aiming device 52.

For a radio frequency power beam, the energy receptor can be a rectifying antenna, or "rectenna" 38. Shown in FIG. 7A is an embodiment of a combination energy receptor 37. The combination energy receptor 37 includes rectenna 38 overlying a solar panel 39. The rectenna 38 is positioned in the upper surface of the combination energy receptor 37 and is comprised of a rectifying antenna to receive and absorb power beam transmission in the form of RF energy. By contrast the solar panel 39 is mounted in the lower portion and adapted to capture and absorb power beam transmission in a different form such as a columnated or laser energy form. The rectenna 38 is essentially transparent to laser energy forms; thereby allowing the vehicle to receive power beams 5 of either type. Because of the narrow bandwidth of laser energy, the combination energy receptor 37 may be advantageously suited to city use.

Figure 7B:
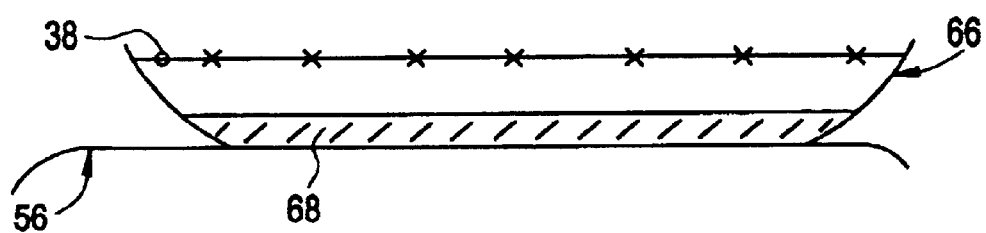
FIG. 7B is a partial cross sectional view of an aspect of the invention showing a single rectenna mounted on a vehicle with insulation between the rectenna receiver and the vehicle interior.

FIG. 7B illustrates a single rectenna 38 within a receiver case 66 mounted on a vehicle 56. This embodiment includes a layer of microwave insulative material 68 disposed between the rectenna 38 and the interior of the vehicle 56. The insulation 68 will absorb and dissipate the excess or waste microwave energy that is not absorbed by the rectenna 38. The insulative material 68 can be a ceramic material such as, for instance, alumina or beryllia having a high absorptivity for the energy beam and a surface finish suited for energy absorption. Alumina can have an absorptivity of 0.94, which approaches the value of 1.0 for an ideal absorber.

Figure 7C:
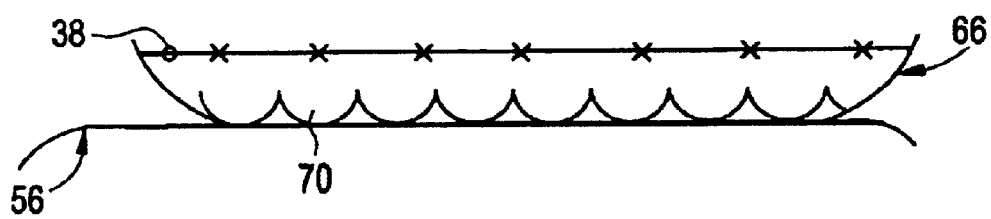
FIG. 7C is an embodiment of the invention similar to FIG. 7B wherein the insulation is replaced by a reflective element.

FIG. 7C illustrates a single rectenna 38 within a case 66 mounted on a vehicle 56. This embodiment includes an energy reflective surface 70 disposed between the rectenna 38 and the interior of the vehicle. Reflective surfaces are well known in the art, being used extensively in, for example, microwave devices to channel microwaves to a chamber or region for use. The reflective surface 70 will reflect the excess or unabsorbed energy back through the rectenna 38 for a second opportunity at absorption. If not absorbed in the second pass, the energy is directed upwards into the atmosphere where it will dissipate harmlessly.

Figure 7D:
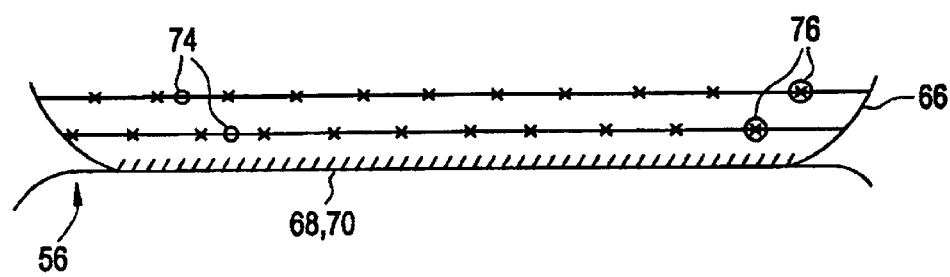
FIG. 7D is a partial cross sectional view of an aspect of the invention showing a multi-tier rectenna arrangement.

FIG. 7D illustrates a multi-tier rectenna 74 within a case 66 mounted on a vehicle 56. The rectenna 74 includes overlying rows of diodes 76. Preferably, the diodes 76 in each row are staggered with respect to diodes in other rows to improve energy absorption. The two-timer rectenna 74 shown in FIG. 7D allows for energy absorption at both the primary and secondary level. Naturally, rectennas with more than two layers are also possible.

Figure 7E:
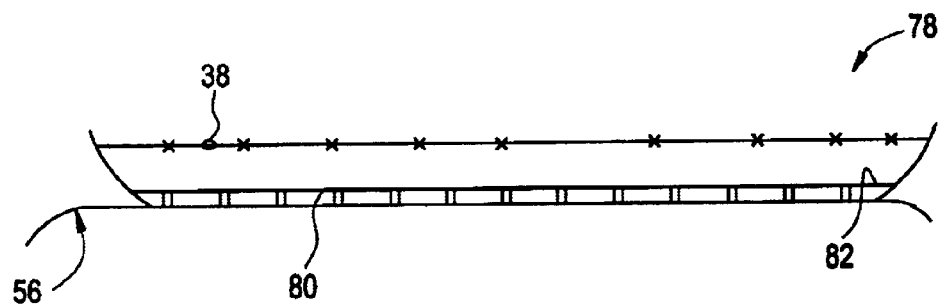
FIG. 7E is a partial cross sectional view of a combination energy receptor according to one aspect of the invention.

FIG. 7E illustrates a combination energy receptor 78 combining a rectenna 38 overlying a direct energy conversion device 80. For example, the direct energy conversion device 80 may be a thermoelectric generator or thermionic power generator. With this combination energy receptor 78, energy that is not absorbed by the rectenna 38 strikes the conversion device 80, heating the device. The conversion device 80 converts the heat to electric power, which is utilized in the power receiver system 44. An energy absorbing surface 82 can also be disposed between the rectenna 38 and conversion device 80 and in thermal contact with the device 80. The surface 82 is preferably a high temperature ceramic material such as alumina coated to increase absorption of energy. The unabsorbed energy passes through the rectenna 38 and strikes the energy absorbing surface 82, thereby heating the surface 82. Heat from the surface 82 is transferred to the conversion device 80, where it is converted into electrical energy for utilization by the power receiver system 44.

Figure 7F:
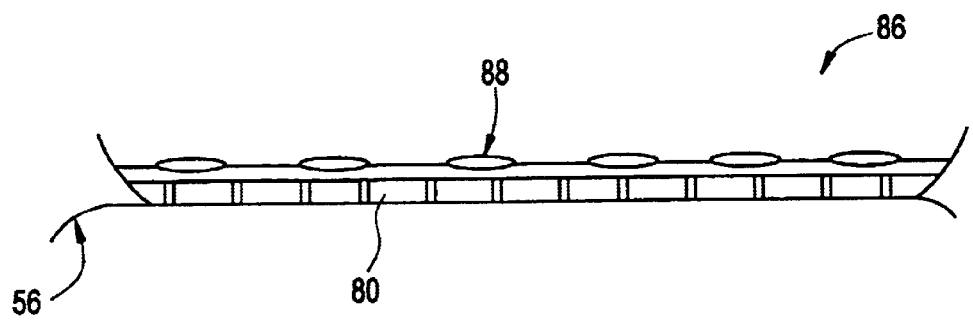
FIG. 7F is a partial cross sectional view of a combination energy receptor according to one aspect of the invention.

FIG. 7F illustrates a combination energy receptor 86 combining a plurality of photovoltaic cells 88 overlying a direct energy conversion 80 device. For example, the photovoltaic cells 88 may overlie a thermoelectric generator. With this energy receptor 86, thermal energy produced in the photovoltaic cells 88 is converted by the conversion device 80 to electric power, which is utilized in the power receiver system 44. With this energy receptor design the power beam 5 is preferably focused to provide high energy density. A high energy density power beam is scanned or "dithered" over a substantial portion of the energy receptor 86 surface to improve energy transfer.

Any of the energy receptor designs may also include either or both of the reflective layer 70 to increase energy absorption and/or the insulative layer 64 to shield the vehicle 56 interior from stray energy.

Figure 12:
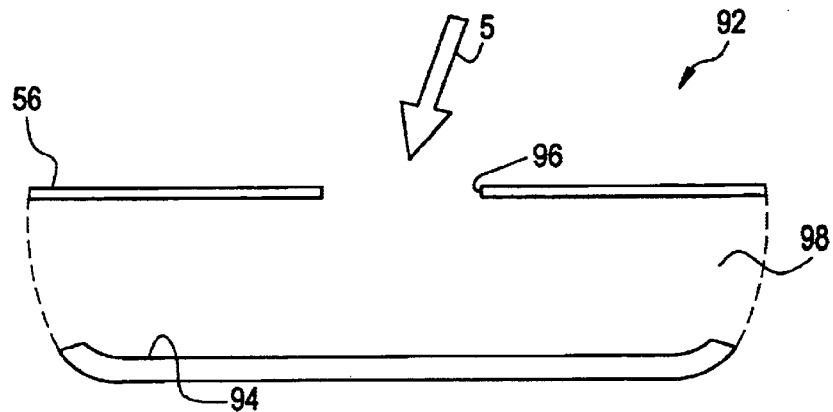
FIG. 12 is a partial cross sectional view of an aspect of the invention showing an enclosed energy receptor.

Alternatively, with a highly focused power beam 5, such as, for instance, a laser beam, the energy receptor 54 could be an enclosed vehicle receptor or an enclosed vehicle receptor and power beam converter 92 as shown in FIG. 12. The enclosed receptor and converter 92 could comprise an enclosed conversion device 94 with a relatively small inlet or aperture 96 connecting an enclosed cavity 98 with the outside environment. The power beam converter is contained within the cavity 98. All of the energy from the power beam 5 is focused for entry through the inlet 96 and contained within the device 92. With all the radiant energy absorbed internal to the energy converter 92, radiative energy leakage is not a concern and the safety of passengers and passersby is heightened. The enclosed receptor and converter 92 is mounted on or within a vehicle and is operably connected to the power receiver system 44.

Figure 12A:
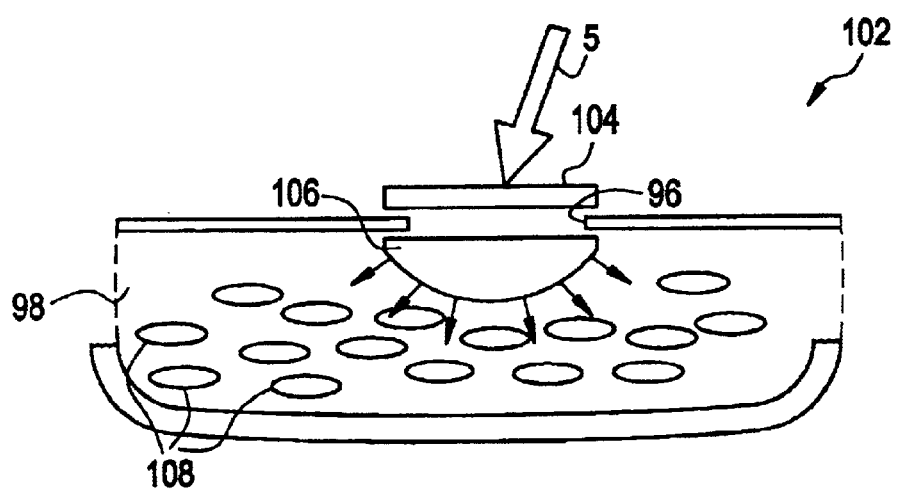
FIG. 12A is a partial cross sectional view of another embodiment of the invention showing an enclosed energy receptor.

FIG. 12A illustrates an enclosed receptor/converter 102 for use with a highly focused power beam 5. The receptor/converter inlet 96 includes a window 104. Preferably the window is spectral, that is the window allows only the specific wavelengths of the power beam 5 to pass through. The beam 5 strikes a dispersion lens 106 that distributes the beam 5 over the full array of photovoltaic cells 108 arranged over the interior wall of the enclosed cavity 98. The dispersion lens 106 and window 104 minimize the escape of energy from the cavity 98, thereby minimizing energy leakage to the environment and increasing converter 102 efficiency.

Figure 12B:
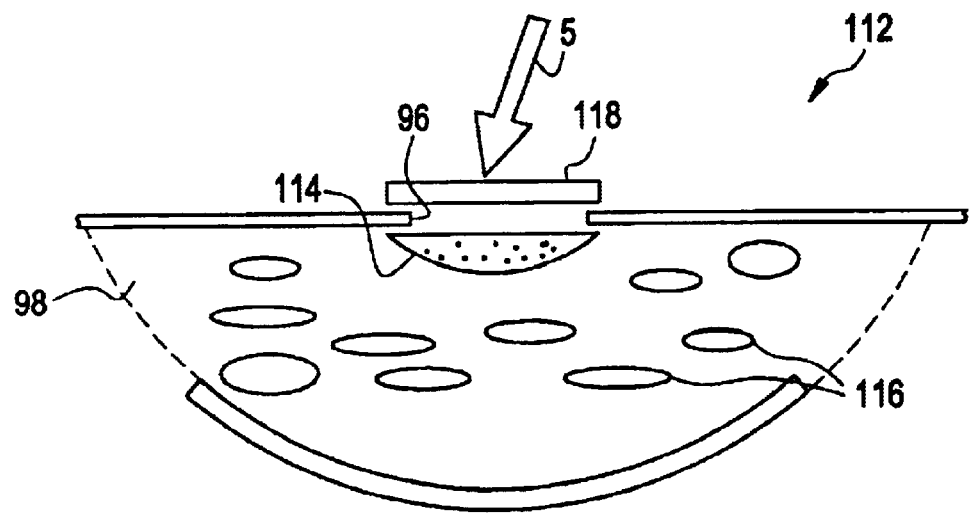
FIG. 12B is a partial cross sectional view of another embodiment of the invention showing an enclosed energy receptor.

FIG. 12B is a different embodiment of an enclosed receptor/converter 112. In this embodiment a high temperature filament plate 114 is disposed adjacent the inlet 96 and a plurality of thermophotovoltaic cells 116 are arrayed over the interior wall of the enclosed cavity 98. Typical thermophotovoltaic materials include gallium antimonide and indium gallium arsenide. The filament plate 114 is constructed of a ceramic material resistant to high temperatures, such as, for example, silicon carbide. Naturally, different temperature resistant materials having spectral and radiative properties matching the optical requirements of the specific thermophotovoltaic cells will improve converter 112 efficiency. Energy from the power beam 5 (which may be columnated light, microwave, electron beam or other form) enters the inlet 96 and heats the filament plate 114. Preferably, the filament plate 114 is heated in excess of 800° C. A window 118 limits radiative leakage from the cavity 98 and protects the heated filament plate 114. The heated filament plate 114 radiates energy to the thermophotovoltaic cells 116, which produce electricity for use by the power receiver system 44.

Figure 13:
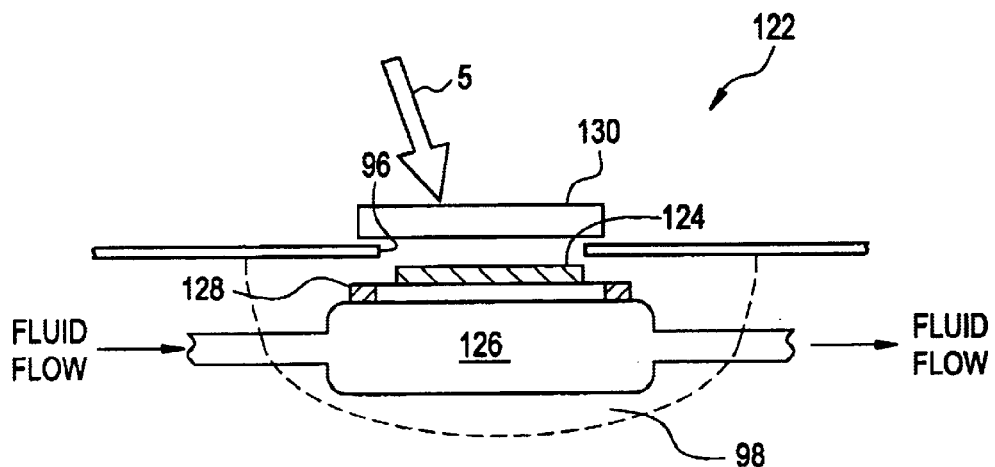
FIG. 13 is a partial cross sectional view of another embodiment of the invention showing an enclosed energy receptor.

FIG. 13 is a different embodiment of an enclosed receptor/converter 122. In this embodiment, an energy receiver plate 124 and a boiler 126 are in heat transfer relationship. The combination is contained within the cavity 98 with the energy receiver plate 124 adjacent the inlet 96. The energy receiver plate 124 is highly absorbent to the power beam 5 energy form and efficient at converting absorbed energy to heat. The energy receiver plate 124 is typically of ceramic construction and similar in size to the inlet 96 opening. The power beam 5 strikes the energy receiver plate 124 which absorbs energy from the power beam 5 and is heated thereby. The energy receiver plate 124 transfers heat to the boiler 126. A working fluid flowing through the boiler 126 is heated and the heated fluid is utilized to propel the vehicle. As used herein,"working fluid" refers to any solid, liquid gaseous or other material that converts thermal energy to power. A working fluid may, but is not required, to undergo a phase change to convert thermal energy to power. A window 130 over the inlet 96 limits radiative leakage from the cavity 98.

Preferably, the energy receptor 122 of FIG. 13 includes a thermal conduction dispersion plate 128 physically disposed between the energy receiver plate 124 and the boiler 126 and in heat transfer relationship with both. The energy receiver plate 124 transfers heat to the physically larger thermal conduction dispersion plate 128, which in turn heats a substantial portion of the boiler 126. The thermal conduction dispersion plate 128 functions to enhance heat transfer from the energy receiver plate 124 to the boiler 126, allowing the use of a smaller energy receiver plate 124 and inlet 96.

Figure 20:
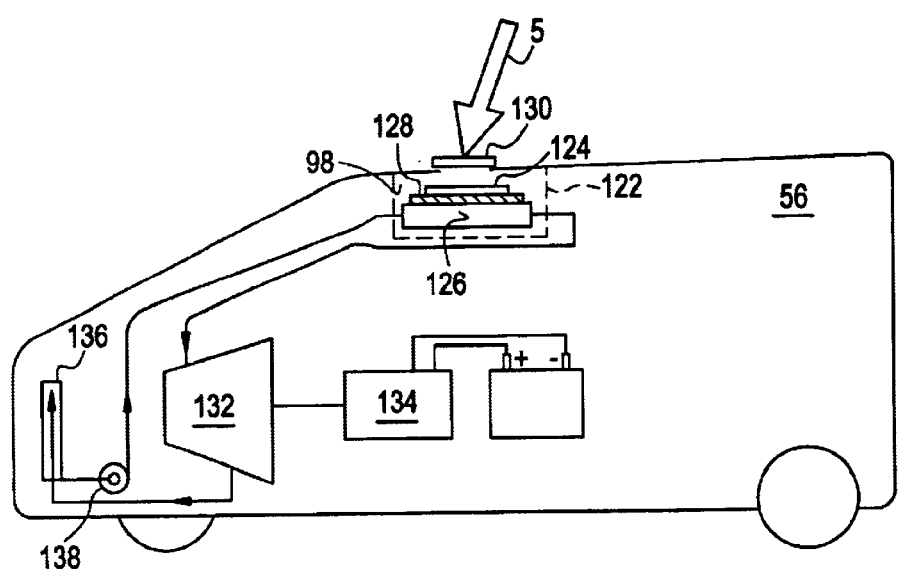
FIG. 20 is a schematic illustration of a vehicle incorporating an embodiment of the remote power system with an enclosed energy receptor.

FIG. 20 illustrates an embodiment of the remote power system 1 using an enclosed energy receptor/converter 122 mounted to a vehicle 56. The power beam 5 is converted into thermal energy within the converter 122. The thermal energy within the converter 122 is used to heat a working fluid. While many working fluids are known, water as a working fluid may be heated in an appropriate system to low or high pressure steam. The heated working fluid functions to drive a conversion device 132, such as a turbine. In the embodiment of FIG. 20, the turbine drives a generator 134, which produces electricity for use in the power receiver system 44. After use in the turbine, the fluid is cooled within a radiator 136 and moved by pump 138 back to the converter 122. It should be noted that while not shown, the turbine could also store energy in a flywheel, ultracapacitor or be used to provide motive power through a conventional drive train utilizing well known components such as a transmission and differential.

Figure 14:
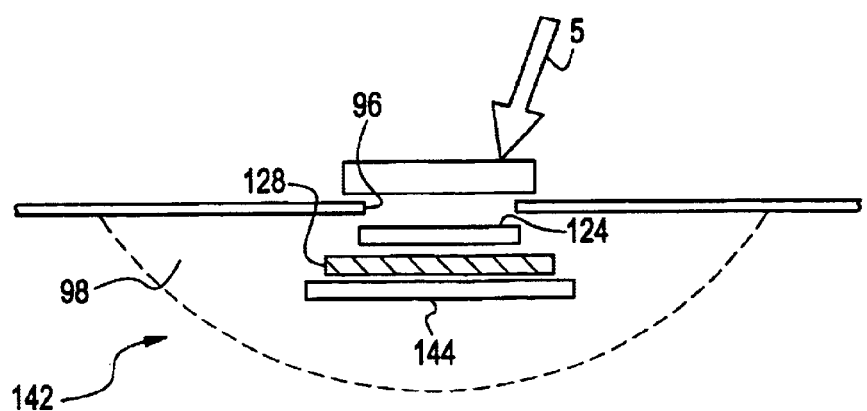
FIG. 14 is a partial cross sectional view of another embodiment of the invention showing an enclosed energy receptor.

FIG. 14 is an embodiment of an enclosed receptor/converter 142 somewhat similar to that of FIG. 13. The enclosed receptor/converter 142 includes an energy receiver plate 124 which functions to absorb energy from a power beam 5 entering the inlet 96 and convert the absorbed energy to heat. The energy receiver plate 124 is in heat transfer relationship with a direct energy conversion device 144. As previously discussed, the direct energy conversion device 144 is typically a thermoelectric generator, thermionic power generator or similar device for converting thermal energy directly to electrical energy. Heat transferred from the energy receiver plate 124 to the direct energy conversion device 144 is utilized to generate electricity for use in the power receiver system 44. Preferably, a thermal conduction dispersion plate 128 is disposed in heat transfer relationship between the energy receiver plate 124 and the direct energy conversion device 144. It should be noted that the conversion efficiency of thermoelectric generators at the present time is so low that this is not currently considered the best conversion device.

Preferably, in any embodiment the window covering the inlet 96 would be transparent to the incoming power beam 5, but would not allow energy internal to the converter to escape. Well known coatings applied over the window surface ensure any internally reflected energy would be reflected back into the converter and reabsorbed.

Obviously, there are many other combinations of devices that can be used for an energy receptor. The many and varied examples of energy receptors described herein are intended to be exemplary and are in no way intended to limit the scope of the invention unless otherwise specifically indicated.

Figure 9:
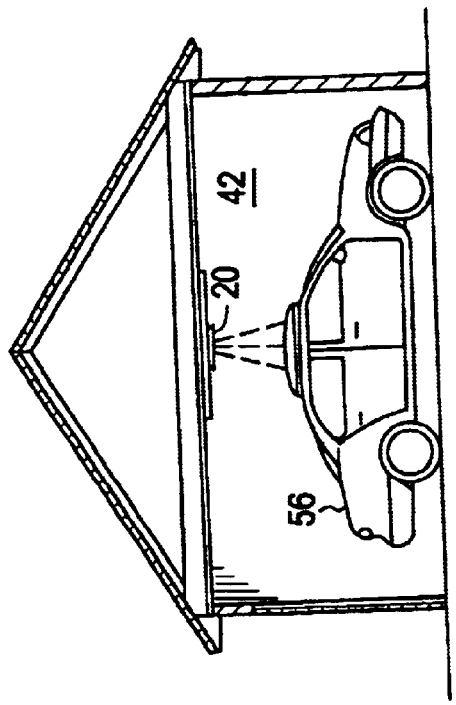
FIG. 9 is a side view of an embodiment of a power transmission unit installed in a garage.
Figure 8:
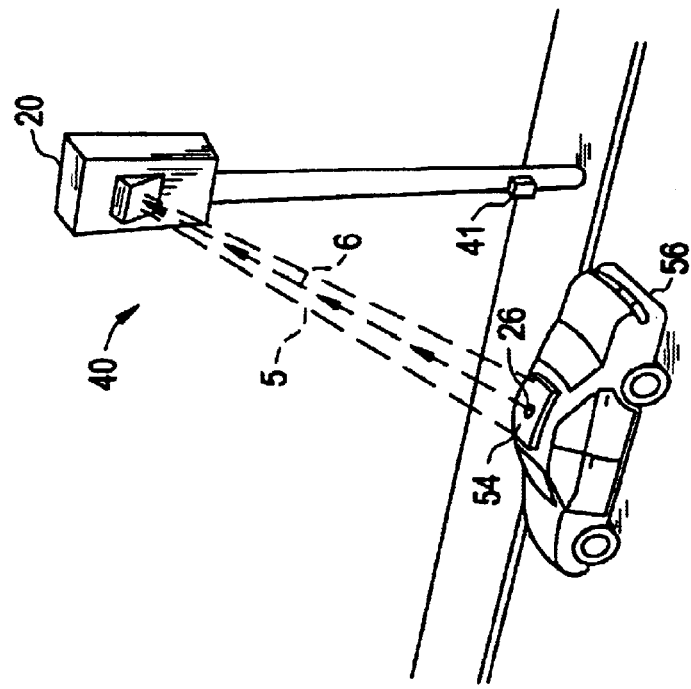
FIG. 8 is a perspective illustration of a power transmission unit incorporating a point of purchase device.

FIGS. 8 and 9 show two possible methods for charging the energy storage unit 13 in a vehicle when the vehicle is not in use. FIG. 8 illustrates a point of purchase power transmission unit 40, including a control 41. The operator of vehicle would exchange currency in the form of cash or electronic transfer with the control 41 corresponding to a preselected amount of electrical energy. While parked in proximity to the point of purchase power transmission unit 40, the vehicle receptor 54 receives a power beam 5 from the power transmission unit 40. In a similar fashion, FIG. 9 shows a vehicle in a garage. A power transmission unit 20 is installed above the vehicle. Charging of the vehicle occurs while the vehicle is parked in proximity with the power transmission unit 20. It is contemplated that there also may be a power transmission unit 20 mounted outside the garage to charge a vehicle parked in the driveway.

FIG. 10 shows a garage where two vehicles may be charged by a single power transmission unit 20 located in the garage 42. Reflecting mirrors 3 are mounted above each vehicle's energy receptor 54 to direct the power beam 5 from the power transmitter 22 to each receptor 54 with or without need for a vehicle communication 6 signal. In addition, power transmission units operated as described above do not require the sophisticated tracking and locating capability of those described earlier. It is contemplated that the vehicles would be charged either sequentially or simultaneously.

Although reference is given specifically to microwave and laser wireless energy beams, these do not preclude the use of any other type of wireless energy beam that may be developed. The feasibility of electron beams, ion beams and other technologies are also contemplated in a remote power system.

Currently, the distance that an all-electric vehicle can travel between charges with, for example, a battery pack as the energy storage unit, is 80–100 miles. This is the range the vehicle could travel if it did not encounter a power transmission unit to recharge the vehicle energy storage unit. But as the system grows and there are more power transmission units along the road to maintain the vehicle charge, the available range in the storage unit becomes less of an issue. The energy that is stored onboard the vehicle provides adequate reserve to move about freely between power transmission units. The power transmission units are constantly topping off the reserve-stored energy in the vehicle so that the vehicle can maintain this free movement.

Until power transmission units expand into rural areas, a hybrid vehicle as described herein above would ease the transition between a typical internal combustion engine vehicle and all-electric vehicle. For instance, electric vehicles would have small gasoline-driven generators that would start automatically to recharge the energy storage unit if a power transmission unit were not encountered for some distance. If enough power transmission units are present to charge the energy storage unit, then the gasoline-driven generator is never started or used.

An example of the operation of an embodiment of the present invention is that of a bus. For illustration purposes it is contemplated the bus is an all-electric bus that has the mobility of a current bus incorporating an internal combustion engine as the mode of power. Consider a 46-passenger bus, having a mass of 15,000 kg and a 195 kW (277-hp) electric motor. For city traveling, consider power transmission units to be spaced every 1 kilometer (km). In certain embodiments, for example, a busy downtown street, it is contemplated that there may actually be a power transmission unit placed every 200 to 300 meters (m), but for this example 1 km will be used. It is assumed that the bus travels at 55 km/h (35 mph) and a power transmission unit has a line of sight visibility of the bus 150 m prior to the power transmission unit and 150 m after the power transmission unit. That is, the power transmission unit has visibility of the bus for 300 m and can charge the onboard energy storage unit for 19.64 seconds at a bus speed of 55 km/h.

The amount of energy that can be transferred at the present time via wireless power transmission is approximately 450 kW. The efficiency of such energy transmissions has been estimated to be about 76%. Therefore, for this example, a conservative value of 150 kW will be received and stored in the energy storage unit of the bus. At 55 km/h, the energy storage unit will receive 0.8182 kW-h of energy as it passes the power transmission unit. Although the bus motor has a full power capability of 195 kW, when the vehicle is traveling at 55 km/h, the motor utilizes about 35 kW. With power transmission units every 1 km, the bus will consume 0.6364 kW-h of energy. That is 22.2% less than can be theoretically supplied by the power transmission unit. Therefore, the bus does not have to receive a power beam from the power transmission unit the entire time between units if the electrical storage unit on the bus is substantially fully charged.

Now consider the same bus making a stop for passengers. To accelerate the vehicle from a stop to 55 km/h, consider the bus to use 175 kW. The bus will have to pause about 25 seconds to allow passengers to enter and exit the bus, and all the time the bus is standing still, the power transmission unit can be charging the electrical energy storage unit. Allow the bus 10 seconds to accelerate up to speed. From the time the bus comes into view of the power transmission unit, stops for passenger movement, and then leaves the bus stop, 1.4583 kW-h of energy is added to the bus's energy storage unit. To accelerate the bus up to 55 km/h, and travel to the next power transmission unit, the bus consumes 0.9316 kW-h of energy. Again, the energy used by the bus is considerably less than was added to the system by the remote power system. Therefore, the bus energy storage unit would not have to receive the power beam the entire time of the stop if it was close to a full charge.

In another example, a private vehicle or private passenger car will be considered. For the suburban setting, it can be assumed that power transmission units are located every 2 km. The private vehicle will be about 750 kg with a 28 kW (40-hp) electric motor. Traveling at 55 km/h (35 mph) the vehicle will require about 4.9 kW of power. Again, with the power transmission unit's line of sight of the vehicle being 300 m, the energy storage unit will receive 0.8182 kW-h of energy. The vehicle will consume 0.1779 kW-h of energy traveling at 55 km/h with 2 km between the power transmission units. This is 78.3% less energy used than is theoretically available to the vehicle from the power transmission unit.

Now consider the above private vehicle traveling at 105 km/h (65 mph) on the highway. The vehicle will require about 17.5 kW of power to travel at this speed. When passing a power transmission unit, the vehicle will receive 0.4286 kW-h of energy which is added to the energy storage unit. With the power transmission units spaced 2 km apart, the vehicle will consume 0.3328 kW-h of energy between possible charging of the energy storage unit onboard the vehicle. This is 22.4% less than can be theoretically received by the vehicle via the wireless power transmission system.

Preferably, the actual energy transmission between a power transmission unit and power receiver system takes place in bursts or pulses or small packets of energy. In this way, each short burst of energy can be acknowledged by the translocator to ensure a safe transfer of energy. Without proper acknowledgment for each energy burst, no more energy will be transferred until the power receiver system and power transmission unit has reestablished a communication link. The bursts can be sized so that if a person were struck by one, two or several of these unacknowledged energy packets or bundles, there would be no effect on the person. It should be realized that the transmission of pulses of energy as a wireless power beam to a receptor and verification of the transmission or receipt of the pulses has application in other areas. As an example, such transmission may be used in laser machining or surgical applications where the energy receptor is a target, such as, for instance, a workpiece.

Consider, for example, a 450 kW power beam used to recharge a traveling vehicle. The distance of communication and energy transmission may be 150 m on either side of the power transmission unit or 300 m total. Guidance and energy beam travel time is a maximum of 500 nanoseconds (ns) between transmitter and receiver for this distance. For a vehicle traveling at 105 km/h, the vehicle will travel 5 microns in 500 ns.

Allow one burst of energy to last 1,000 ns, then the power transmission beam is shut down, waiting for verification from the vehicle receiver. The response time for verification of reception of the energy will be a maximum of about 500 ns. Then another burst of energy is transmitted, etc. As the vehicle moves closer to the power transmission unit, the response time for verification of receipt of the energy beam will lessen; therefore, more energy will be transmitted. And as the vehicle moves away, less energy will be transmitted.

One burst of energy at the 450 kW level for 1,000 ns is 0.450 w-s. This is equivalent to being exposed to 1/220 the energy of a 100 watt light bulb for 1 second. Without verification of receipt from the vehicle, this is the maximum energy that a human being or inanimate object would be exposed to. Additionally, the remote power system has no lag time or inertia, when the power beam is turned off there is no residual energy in transit. Further, the power transmitter may be instantly deactivated. Thus, the remote power system 1 presents an inherently safe energy transmission system. The use of a coded and/or encrypted vehicle communication signal further enhances the safety of the remote power system 1 by preventing stray signals or interference from actuating the power transmission unit, thereby making false activation, either intentional or unintentional, of the power transmitter difficult.

Other safety devices may be added to different embodiments of the remote power system 1. The power transmission unit 20 may comprise a motion or position sensitive switch. When the power transmission unit 20 is jarred or moved out of position, the switch will deactivate the power transmitter 22, ending power beam 5 transmission. Thus, a power transmitter 22 in a hurricane or earthquake or on a utility pole 21 struck by a vehicle would be shut down before the power beam 5 could cause damage or injury. It should be noted that the power transmitter 22 would also be shut down in the above circumstances if the vehicle communication signal 6 was lost by the power transmission unit 20.

Figure 15:
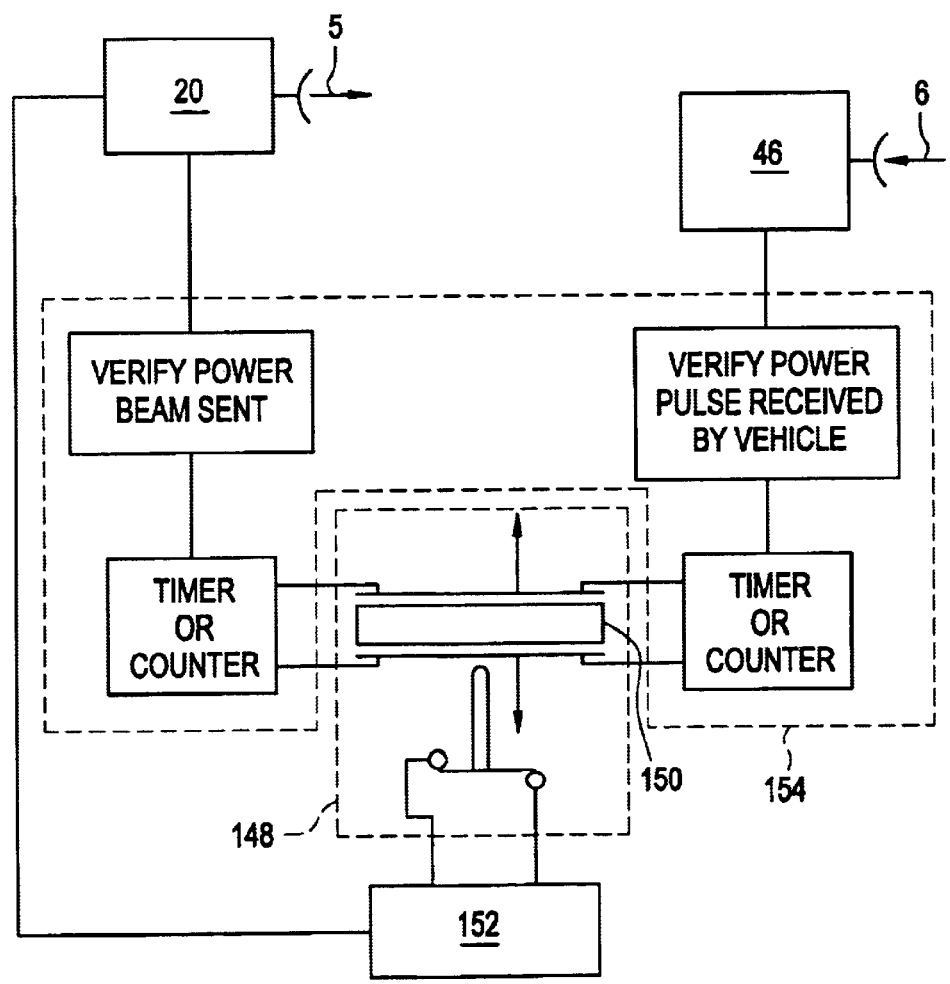
FIG. 15 is a schematic view of an aspect of the invention showing a two-way fuse.

With reference to FIG. 15, in some embodiments the power transmission unit 20 may comprise a two-way fuse 148. The two-way fuse 148 is activated by the energy transmitted from the power transmitter 22 and deactivated by the acknowledgment of energy received by the power receiver system via communication signal 6. When the energy transmitted is not acknowledged as received, the two way fuse 148 activates a shutoff device 152, shutting down the power transmitter 22. The shutoff device 152 can be a mechanical switch, a disposable electrical connection or other well-known device. The power transmitter shut down may be for a period of time, after which time the fuse 148 automatically reactivates and allows the power transmitter 22 to begin transmission of a power beam 5 to a verified receptor 54. Multiple two-way fuse deactivations within a set time period would permanently deactivate the fuse 148 and power transmitter 22, requiring manual replacement or resetting of the fuse 148.

In an embodiment of the invention wherein the power beam is continuous, the two way fuse will be activated by the amount of energy transmitted and deactivated by the amount of energy received. When the amount of energy transmitted is greater by a predetermined amount than the amount of energy acknowledged as received, the two way fuse activates a shutoff device 152, shutting down the power transmitter 22.

Alternatively, the two-way fuse 148 may be permanently deactivated initially; requiring manual replacement or resetting before the power transmitter 22 can again be activated. Preferably, the two-way fuse 148 automatically reactivates after deactivation when the power transmission unit 20 establishes a new communication link with the power receiver system.

The two-way fuse can comprise multiple configurations. In one embodiment shown in FIG. 15, the two-way fuse 148 comprises a piezoelectric element 150. After a communication link has been established between, for example, the power receiver system and the power transmission unit 20, the power transmitter 22 sends a first power beam 5 pulse to the energy receptor 54, deflecting the piezoelectric element 150 one increment toward activating the shutoff device 152. The vehicle 56 receives the power beam pulse at the energy receptor 54, converts the power beam pulse to a usable energy form at the converter 11 and stores the energy in the storage unit 13. The power receiver system 44 acknowledges receipt of the power beam pulse and requests a second power beam pulse from the power transmission unit 20 via the translocator signal 6. The translocator signal 6 is normally a constant beacon. Acknowledgment by the power receiver system of a burst of energy from the power transmission unit is superimposed with the translocator signal to activate the two-way fuse 148. As long as more energy is needed, transmission of the translocator signal 6 and therefore the energy beam 5 will continue.

The acknowledgement of the first power beam pulse is received by the power unit communication device 46 and functions to deflect the piezoelectric element 150 back one increment away from activating the shut off device 152. The request for a second power beam pulse is processed by the power unit controller 48, and a second pulse is sent to the energy receptor 54, again deflecting the piezoelectric element 150 one increment toward activating the shutoff device 152. In sum, for each power beam pulse that is transmitted from the power transmitter 22, the piezoelectric element 150 deflects one increment toward activating the shutoff device 152 and terminating power beam transmission. For each acknowledgment 6 from the same power receiver system, the piezoelectric element 150 deflects one increment away from activating the shutoff device 152. The deflection of the piezoelectric element 150 can be designed to activate the shutoff device 152 and terminate power transmission before a dangerous number of power beam pulses are transmitted.

Figure 16:
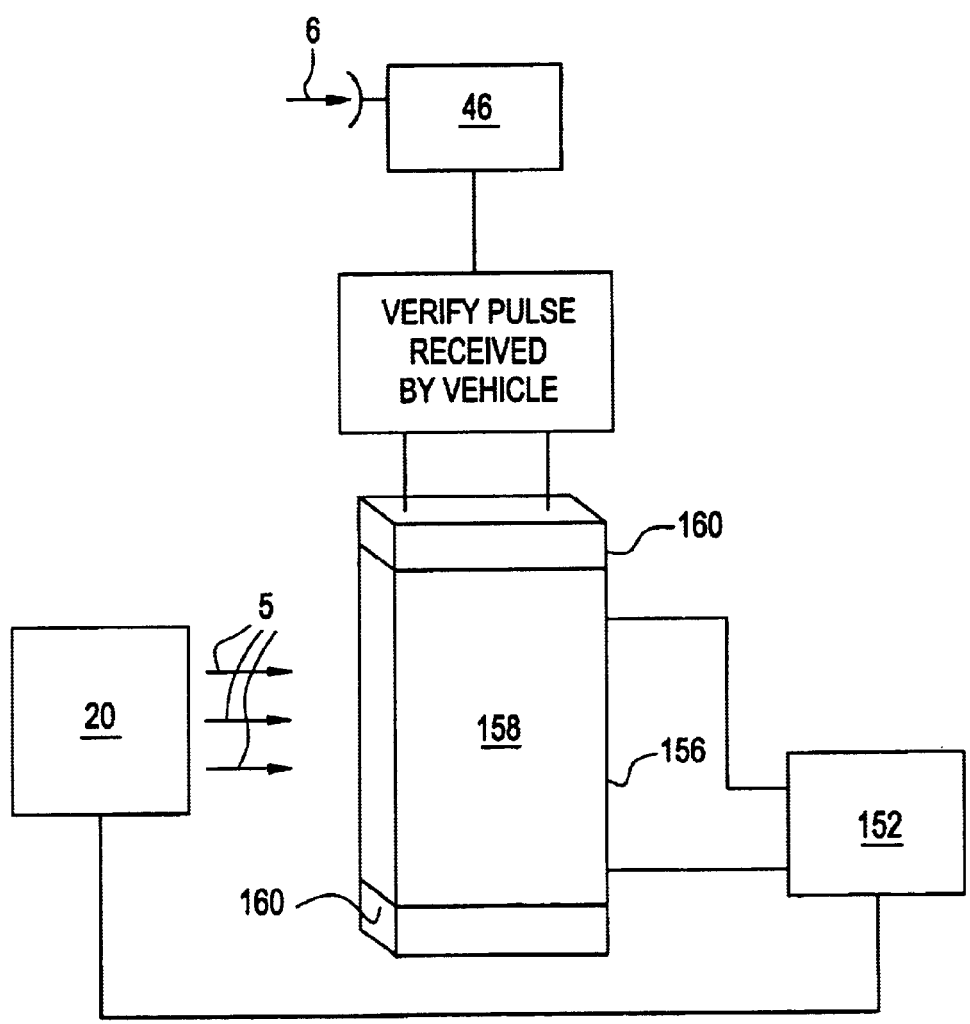
FIG. 16 is a schematic view of an aspect of the invention showing a pathway sensor safety device.

Another safety device that can be incorporated into the power transmission unit 20 is a pathway sensor 156 which is schematically shown in FIG. 16. The pathway sensor is mounted within the path of the power beam 5, for example, in a channel or conduit of the power transmitter 22. The pathway sensor 156 functions to shut down the power transmission unit 20 prior to any abnormally high levels of energy leaving the power transmitter 22. Thus, the pathway sensor provides for an inherently safe remote power system.

The pathway sensor 156 comprises a sensor element 158. A portion of the power beam 5 strikes the sensor element 158 and a small portion of the power beam is absorbed, causing heating of the sensor element 158. Typically, only a very small percentage (less than 0.1%) of the power beam is absorbed by the pathway sensor. The heat absorbed by the sensor element 158 is removed by an external cooling source 160, such as, for example, a thermoelectric cooling device. The cooling source 160 is activated by the translocator signal 6 through the power unit controller or separate safety monitor (not shown). As long as the power unit communication device 46 receives the translocator signal 6, the cooling source 160 will remain activated and heat imposed by the power beam pulses will be removed from the sensor element 158. Since the sensor element 158 is continuously cooled, this embodiment is properly named a continuously cooled pathway sensor. If a predetermined number of power beam pulses strike the sensor element 158 without cooling, the sensor element overheats and "burns out", (i.e., breaks) actuating a shutdown device 152 to terminate transmission of a power beam 5 from the power transmitter 22. The continuously cooled pathway sensor 156 would have to be replaced before the power transmitter 22 could resume transmission of a power beam 5.

The shape of the sensor element 158 presented to the power beam 5 will establish the amount of energy, and thereby heat, absorbed from each power beam pulse. Materials such as, for example, aluminum, copper, steel, stainless steel and alloys thereof are suitable for manufacture of the sensor element 158. The heat in the sensor element 158 must be dissipated quickly by the cooling source 160 for the power transmitter 22 to operate most efficiently. Therefore, the design and selection of the sensor element 158 profile will depend on the radiative and conductive properties of the sensor element 158 material chosen, surface finish, ambient temperature within the power transmitter conduit, radiation view factors, type and magnitude of the power beam, etc. While almost any sensor element 158 profile is possible, it is believed that sensor elements having trapezoidal, triangular, circular, ellipsoidal and diamond cross-sectional shapes are advantageous. The sensor element 158 may also comprise a thin wire or wires, a grid of wires, a thin wire with a tab or wafer or multiple tabs or wafers in the power beam pathway. The use of a tab or wafer in cooperation with a wire sensor will increase the amount of energy absorbed from each power beam pulse, assuring sensor element burnout and deactivation of the power transmitter if cooling from the cooling source 160 is not maintained.

Figure 17:
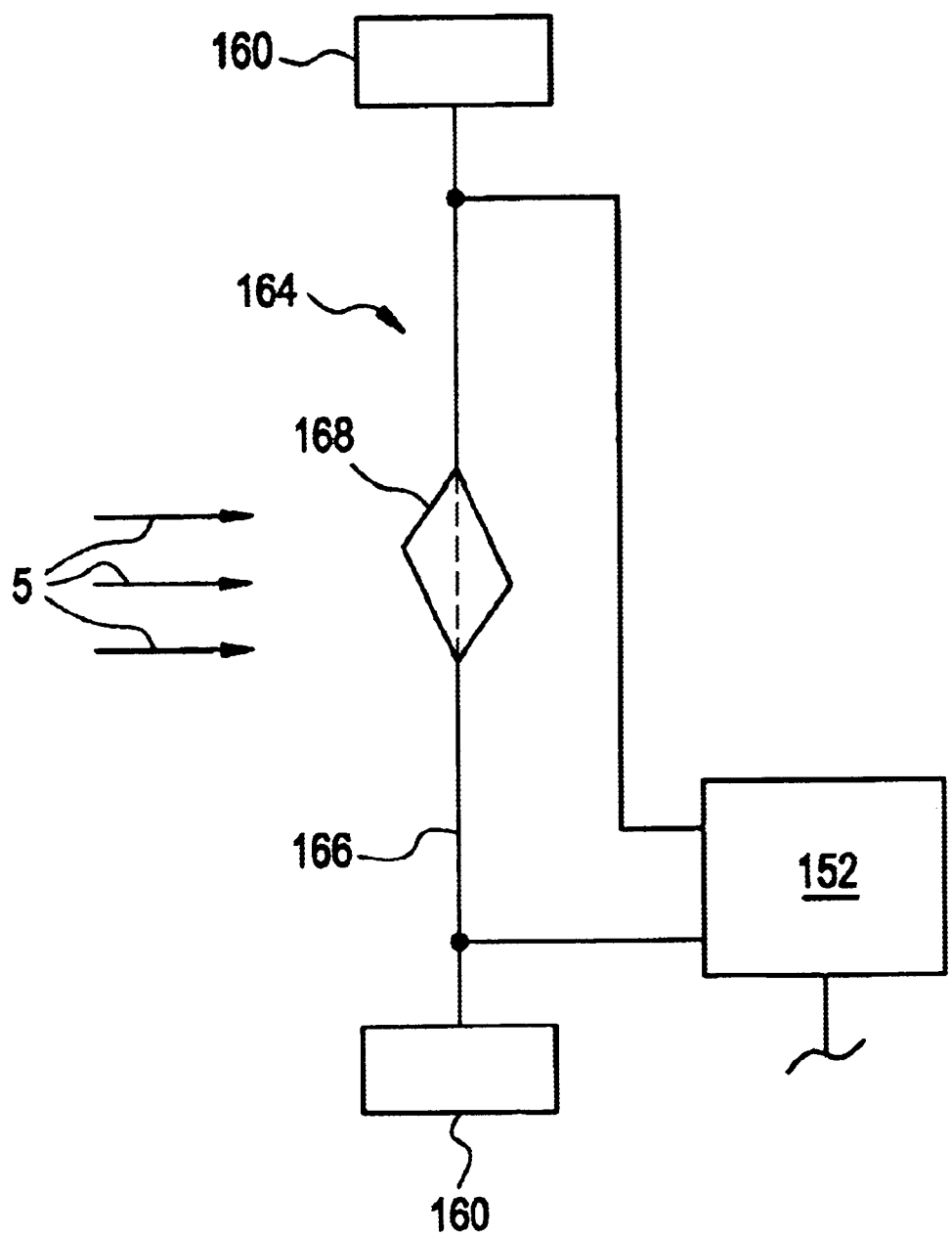
FIG. 17 is a schematic view of another embodiment of a pathway sensor safety device.

FIG. 17 illustrates a different embodiment of a pathway sensor 164 wherein the sensor element is intermittently or "pulse" cooled. The sensor element is a thin wire 166, and may include a tab or wafer 168 to increase energy absorbed from each power beam pulse. In this embodiment, for each power beam pulse acknowledgment received by the power unit communication device 46, the cooling source 160 is turned on momentarily to dissipate the portion of the energy absorbed by the acknowledgement of power beam receipt. Without acknowledgment of the power beam pulse, the cooling source 160 is not activated and the sensor element 166 burns out, actuating the shut off device 152 and terminating power beam 5 transmission. Reactivation of the power transmitter 22 requires manual replacement of the burned out sensor element 166.

Figure 18:
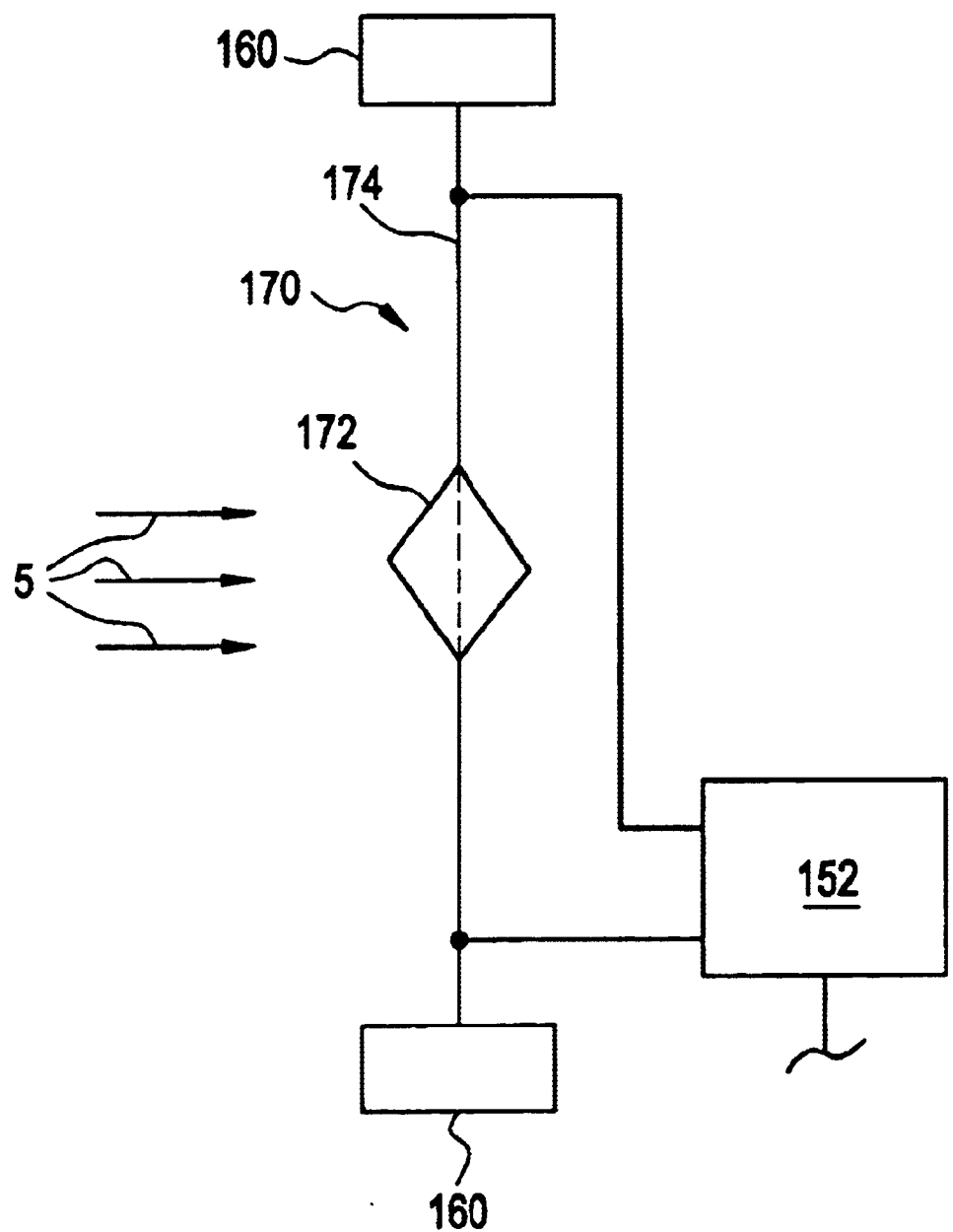
FIG. 18 is a schematic view of another embodiment of a pathway sensor safety device.

FIG. 18 illustrates another embodiment of a pathway sensor 170 wherein the sensor element is a piezoelectric element. Preferably the sensor element comprises a piezoelectric tab or wafer 172 mounted to a support wire 174. The piezoelectric element 172 is sized and finished so that a power beam pulse striking the element 172 distorts the element a predetermined amount. The acknowledgment signal from the vehicle 56 returns the piezoelectric element 172 to its original condition. Therefore, the sensor element 172 normally transitions between the normal and deflected condition. If too many power pulses strike the piezoelectric element 172 without a corresponding acknowledgment signal, the sensor element 172 distorts to the point where the support wire 174 "fails, actuating the shut off device 152 and terminating power beam 5 transmission. Reactivation of the power transmitter 22 requires manual replacement of the burned out sensor element 172.

Figure 19:
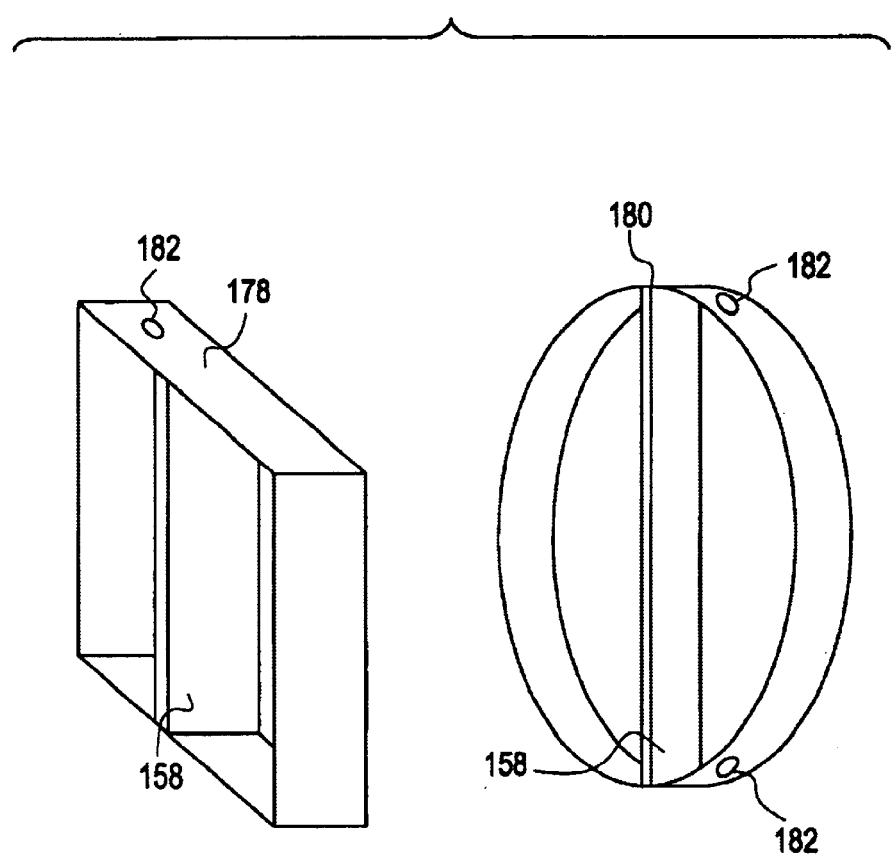
FIG. 19 is a perspective view of a pathway sensor element mounted in different embodiments of a support frame.

For certain applications, pathway sensor response may become an issue. That is, poor sensor response to high heat transfer transients; heating, cooling, etc. will be a function of the mass of the sensor, the diameter of the wire, and/or the surface area of the tab or wafer, the thickness of the wafer, etc. Therefore, an alternative pathway sensor configuration (not shown) would have a pathway sensor including simultaneous balanced heating and cooling of the wire, grid or wafer tab elements stimulated continuously by the outgoing power beam and the incoming vehicle communication signal, respectively. If one of these stimulants fails causing interruption of the balanced heating and cooling, the element fails and the power beam will be shut down. If sensor element cooling were lost due to a system failure or loss of the vehicle communication signal, the sensor element would overheat and burn out, shutting down the power transmitter and power beam immediately. If the power transmitter fails, the power beam is terminated Since some embodiments of a pathway sensor require replacement after burn out, the sensor element is desirably readily replaced. FIG. 19 illustrates, for example, square 178 and circular 180 pathway sensor frames within which a sensor element is mounted. Other pathway shapes and corresponding pathway sensor frame shapes are contemplated by the invention. Naturally, any type of sensor element could similarly be mounted in the frames 178, 180. The frames fit within a correspondingly shaped power transmitter conduit. Electrical contacts 182 on the pathway sensor frames 178, 180 physically contact corresponding contacts on the shutdown device 152. The frames 178, 180 and thereby the burned out sensor element are quickly and easily replaced.

Figure 22:
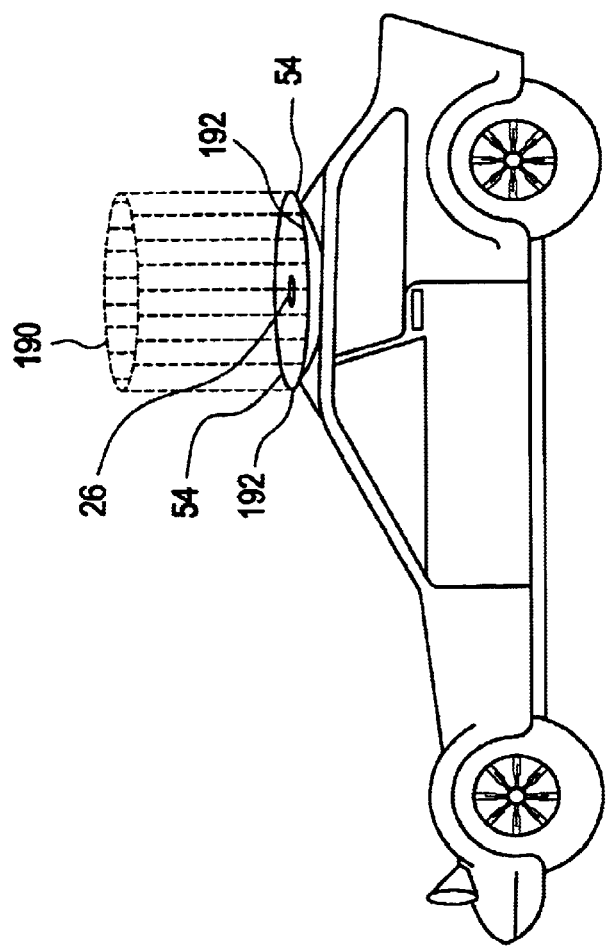
FIG. 22 is an embodiment of the invention incorporating a security zone.

The power receiver system 44 can comprise a security zone enveloping the region around and/or above the energy receptor 54 for additional safety. In this way, if someone inadvertently places a hand in the security zone around the energy receptor 54, the power transmitter unit is signaled to stop transmitting the power beam 5. In one embodiment shown in FIG. 22 a plurality of motion sensors 192 survey or monitor the area above the vehicle energy receptor 54. The interlocking of the security zone 190 with the translocator signal 6 on the vehicle will shut down the wireless power beam 5 if there is a breach of the security zone in the region of the energy receptor 54. Any object that crosses into the security zone 190 triggers the motion sensors 192 and interrupts the translocator signal 6, stopping the wireless power beam 5.

This technology is well known for detection systems in homes, around automated machinery in manufacturing facilities, security systems in museums, prisons, banks, etc. This will render the area above the energy receptor safe for any people in close proximity or those that may accidentally (or purposely) touch the energy receptor area. The security zone 190 may also move with the energy receptor 54 if required for added security.

Figure 23:
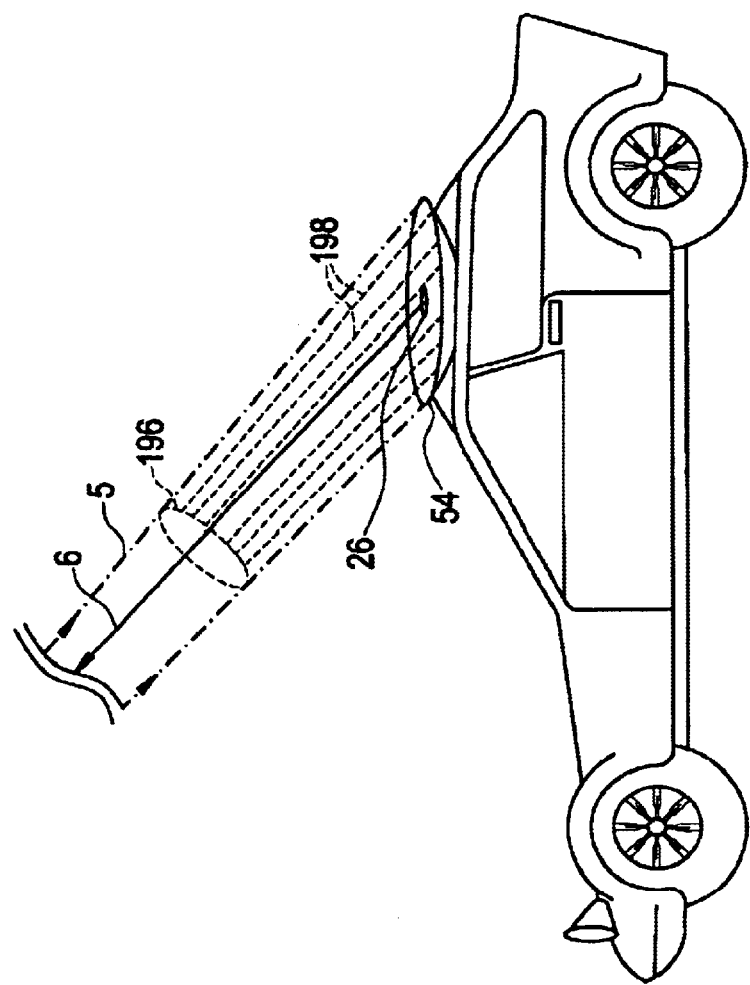
FIG. 23 is another embodiment of the invention incorporating a security zone.

FIG. 23 shows another embodiment where the translocator signal creates a security zone 196 above the energy receptor 54. Here a first translocator signal 6 emanates from the translocator antenna 26 and additional translocator signals 198 emanate from around the periphery of the energy receptor. Continuous or intermittent translocator signals 198 can be transmitted in rotation, simultaneously or however (sequential, continuous, intermittent, etc.) from various locations on the energy receptor. Any object that crosses into the security zone 196 interrupts the additional translocator signals 198 and thereby signals the power transmission unit to shut down transmission of the power beam. The security zones 190, 196 ensure safe power transmission while recharging is taking place.

The inventive remote power communication system 1 eliminates many of the problems associated with internal combustion driven systems. Vehicles can travel on their routes with convenient in-route charging. There will be minimum route changes needed to accommodate vehicle recharging. The vehicles retain full mobility and can avoid any traffic tie-ups.

The remote power communication system 1 will have a thermal impact on the environment caused by the power beam 5 traveling through the atmosphere. However, the thermal pollution caused by the remote power system is three to four orders of magnitude less than the thermal pollution presently caused by conventional internal combustion engine powered vehicles. The inventive remote power communication system therefore provides a phenomenal reduction in thermal pollution of the environment.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A remote power system comprising:
   an energy source;
   a power transmission unit operably connected to the energy source comprising:
      power unit communication means for receiving a power beam request signal,
      power unit transmitter means selectively activatable between off and on conditions for transmitting energy as a wireless power beam in the on condition,
      power unit controller means operably connected to the power unit communication means and the power unit transmitter means for activating the power unit transmitter means from the off condition to the on condition after the power transmission unit receives the power beam request signal; and a first power receiver system comprising:
         energy receptor means for receiving the wireless power beam,
         energy conversion means for transforming energy in the received wireless power beam to a usable energy form, and
         translocator means for transmitting the power beam request signal as a function of a demand for energy,
      wherein the wireless power beam is in the form of a plurality of discrete energy pulses.

2. The remote power system of claim 1, wherein the first power receiver system comprises energy storage means for storing energy in the usable energy form and power usage monitor means for determining a level of energy stored in the storage means, the translocator means operably connected to the power usage monitor means for transmitting the power beam request signal when the stored energy level is below a predetermined level and terminating the signal when the stored energy level is at or above the predetermined level.

3. The remote power system of claim 1, wherein the power transmission unit comprises locating means for locating the first power receiver system energy receptor means and aiming means for directing the wireless power beam thereto.

4. The remote power system of claim 1, further comprising a second power receiver system having second energy receptor means for receiving the wireless power beam wherein the power transmission unit transmits the power beam to both the first and second energy receptor means.

5. The remote power system of claim 1, wherein the power transmission unit comprises two way fuse means for terminating transmission of the power beam after a predefined amount of energy has been transmitted unless the first power receiver system verifies receipt of the predefined amount of energy to the power transmission unit.

6. The remote power system of claim 1, wherein the power transmission unit comprises two way fuse means for terminating transmission of the power beam after a predefined amount of energy has been transmitted unless the first power receiver system verifies receipt of the predefined amount of energy to the power transmission unit and wherein the two-way fuse means comprises a piezoelectric element.

7. The remote power system of claim 1, wherein the power transmission unit comprises pathway sensor means at least partially located within the power beam, for terminating transmission of the power beam after a predefined amount of energy has been transmitted unless the first power receiver system acknowledges receipt of the predefined amount of energy to the power transmission unit.

8. The remote power system of claim 1, wherein the energy conversion means transforms the received power beam to a thermal energy form.

9. The remote power system of claim 1, wherein the energy conversion means transforms the received power beam to a supply of a working fluid.

10. The remote power system of claim 1, wherein the energy receptor means and the energy conversion means comprise rectenna means for receiving the wireless power beam and transforming energy in the received power beam to a usable energy form.

11. The remote power system of claim 1, wherein the energy receptor means and the energy conversion means comprise enclosed energy receptor means for receiving the wireless power beam and transforming energy in the received power beam to a usable energy form.

12. The remote power system of claim 1, wherein the energy receptor means and the energy conversion means comprise combination energy receptor means for receiving the wireless power beam and transforming energy in the received power beam to a usable energy form.

13. The remote power system of claim 1, wherein the translocator means transmits the power beam request signal in a single direction.

14. The remote power system of claim 1, wherein the translocator means transmits the power beam request signal in a plurality of directions.

15. The remote power system of claim 1, wherein the translocator means alternates between transmission of the power beam request signal in a single direction and transmission of the power beam request signal in a plurality of directions.

16. The remote power system of claim 1, wherein the power transmission unit comprises means for transmission of a power unit communication signal and the first power receiver system comprises means for receiving the power unit communication signal, the power beam request signal and the power unit communication signal providing for the establishment of a two way communication link between the power transmission unit and the first power receiver system.

17. The remote power system of claim 1, wherein the power unit transmitter means transmits the directional wireless power beam at various frequencies.

18. The remote power system of claim 1 wherein the power transmission unit is mounted to an airborne vehicle.

19. The remote power system of claim 1 comprising a vehicle including the power receiver system operably connected thereto.

20. A remote power system comprising:
    an energy source;
    a power transmission unit operably connected to the energy source comprising:
       power unit communication means for receiving a power beam request signal, power unit transmitter means selectively activatable between off and on conditions for transmitting energy as a wireless power beam in the on condition, power unit controller means operably connected to the power unit communication means and the power unit transmitter means for activating the power unit transmitter means from the off condition to the on condition after the power transmission unit receives the power beam request signal; and a first power receiver system comprising:

energy receptor means for receiving the wireless power beam, energy conversion means for transforming energy in the received wireless power beam to a usable energy form, and translocator means for transmitting the power beam request signal as a function of a demand for energy, wherein the power unit transmitter means transmits the wireless power beam as a first discrete energy pulse, the first power receiver system verifies receipt of the first energy pulse to the power transmission unit and the power unit transmitter transmits a second energy pulse only after verification.

21. A remote power system comprising:

an energy source;

a power transmission unit operably connected to the energy source comprising:

power unit communication means for receiving a power beam request signal, power unit transmitter means selectively activatable between off and on conditions for transmitting energy as a wireless power beam in the on condition, power unit controller means operably connected to the power unit communication means and the power unit transmitter means for activating the power unit transmitter means from the off condition to the on condition after the power transmission unit receives the power beam request signal; and a first power receiver system comprising:

energy receptor means for receiving the wireless power beam, energy conversion means for transforming energy in the received wireless power beam to a usable energy form, and translocator means for transmitting the power beam request signal as a function of a demand for energy, wherein the power transmission unit comprises means for transmission of a power unit communication signal and the first power receiver system comprises means for receiving the power unit communication signal, the power beam request signal and the power unit communication signal providing for the establishment of a two way communication link between the power transmission unit and the first power receiver system wherein the two-way communication link must be established before the power unit transmitter means is activatable to the on condition.

22. A remote power system comprising:

an energy source;

a power transmission unit operably connected to the energy source comprising:

power unit communication means for receiving a power beam request signal, power unit transmitter means selectively activatable between off and on conditions for transmitting energy as a wireless power beam in the on condition, power unit controller means operably connected to the power unit communication means and the power unit transmitter means for activating the power unit transmitter means from the off condition to the on condition after the power transmission unit receives the power beam request signal; and a first power receiver system comprising:

energy receptor means for receiving the wireless power beam, energy conversion means for transforming energy in the received wireless power beam to a usable energy form, translocator means for transmitting the power beam request signal as a function of a demand for energy, and proximity detection means for detecting an object within a security zone adjacent the energy receptor means, the proximity detection means operably connected to the first power receiver system to end transmission of the power beam request signal when the object enters the security zone.

23. The remote power system of claim 22, wherein the proximity detection means comprises a member selected from the group consisting of a motion detector and a translocator signal.

24. A wireless power system comprising:

a first power receiver system;

an energy source;

a power transmission unit operably connected to the energy source comprising:

power unit transmitter means for transmitting energy as a wireless power beam to the first power receiver system, and power unit controller means operably connected to the power unit transmitter means for controlling the power unit transmitter means, wherein the power unit transmitter means transmits the wireless power beam as a first discrete energy pulse, the first power receiver system verifies receipt of the first energy pulse to the power transmission unit and the power unit transmitter means transmits a second energy pulse only after verification.

25. A wireless power system comprising:

an information signal;

a first power receiver system;

an energy source;

a power transmission unit operably connected to the energy source and the information signal comprising:

power unit transmitter means for transmitting the information signal and energy from the energy source as a wireless power beam to the first power receiver system, and power unit controller means operably connected to the power unit transmitter means for controlling the power unit transmitter means.

26. The wireless power system of claim 25 wherein the information signal originates from a signal source external to the power transmission unit and a communication interface connects the signal source to the power transmission unit.

27. The wireless power system of claim 25 wherein the power unit transmitter means transmits the wireless power beam as a discrete pulse, the first power receiver system verifies receipt of the pulse to the power transmission unit and the power unit transmitter transmits a subsequent pulse only after verification.

28. A wireless power system comprising:
an information signal;
an energy source;
a power transmission unit operably connected to the energy source and the information signal comprising:
power unit transmitter means for transmitting energy as a wireless power beam to the first power receiver system,
power unit controller means operably connected to the power unit transmitter means for controlling the power unit transmitter means, and
a power unit communication device for transmission of the information signal; and
a first power receiver system comprising receiver means for receiving the information signal.

29. A wireless power system comprising:
an energy source;
a power transmission unit operably connected to the energy source comprising:
power unit transmitter means for transmitting energy as a wireless power beam to the first power receiver system, and
power unit controller means operably connected to the power unit transmitter means for controlling the power unit transmitter means, and
a power unit communication device for transmission of a first information signal and receipt of a second information signal; and
a first power receiver system comprising receiver means for receiving the first information signal from the power unit communication device and transmitting the second information signal to the power unit communication device.

30. The wireless power system of claim 29 wherein the first and second information signals provide a bi-directional communication link between the power transmission unit and the first power receiver system.

31. The wireless power system of claim 29 wherein a communication interface connects a signal source external to the power transmission unit to the power transmission unit, the first information signal originates from the signal source and the second information signal is sent to the signal source.

32. The wireless power system of claim 29 wherein the power receiver system comprises a translocator and the second information signal comprises a translocator signal.

33. A wireless power system comprising:
a first power receiver system;
an energy source;
a power transmission unit operably connected to the energy source comprising:
power unit transmitter means for transmitting energy as a wireless power beam to the first power receiver system,
power unit controller means operably connected to the power unit transmitter means for controlling the power unit transmitter means, and
two way fuse means for terminating transmission of the power beam after a predefined amount of energy has been transmitted unless the first power receiver system verifies receipt of the predefined amount of energy to the power transmission unit.

34. A wireless power system comprising:
a first power receiver system;
an energy source;
a power transmission unit operably connected to the energy source comprising:
power unit transmitter means for transmitting energy as a wireless power beam to the first power receiver system,
power unit controller means operably connected to the power unit transmitter means for controlling the power unit transmitter means, and
pathway sensor means at least partially located within the power beam for terminating transmission of the power beam after a predefined amount of energy has been transmitted unless the first power receiver system acknowledges receipt of the predefined amount of energy to the power transmission unit.

35. A wireless power system comprising:
a first power receiver system comprising,
energy receptor means for receiving a wireless power beam, and
translocator means for transmitting a power beam request signal;
an energy source;
a power transmission unit operably connected to the energy source comprising:
power unit transmitter means for transmitting the wireless power beam to the first power receiver system,
power unit controller means operably connected to the power unit transmitter means for controlling the power unit transmitter means, and
proximity detection means for detecting an object within a security zone adjacent the energy receptor means, the proximity detection means operably connected to the first power receiver system to end transmission of the power beam request signal when the object enters the security zone.

36. A method for transmitting a wireless power beam to a power receiver system having an energy receptor comprising:
starting transmission of a power beam request signal;
receiving the power beam request signal at a first power transmission unit;
starting transmission of the wireless power beam from a first power transmission unit to the energy receptor in response to receiving the power beam request signal;
stopping transmission of the power beam; and
losing the power beam request signal at the first power transmission unit wherein the step of stopping transmission of the power beam is a function of the loss of the power beam request signal.

37. A method for transmitting a wireless power beam to a power receiver system having an energy receptor comprising:
starting transmission of a power beam request signal;
receiving the power beam request signal at a first power transmission unit;
starting transmission of the wireless power beam from a first power transmission unit to the energy receptor in response to receiving the power beam request signal;
stopping transmission of the power beam; and
ending transmission of the power beam request signal wherein the step of stopping transmission of the power beam is a function of the end of the power beam request signal.

38. A method for transmitting a wireless power beam to a power receiver system having an energy receptor comprising:
starting transmission of a power beam request signal;

receiving the power beam request signal at a first power transmission unit;

starting transmission of the wireless sower beam from a first power transmission unit to the energy receptor in response to receiving the power beam request signal; and stopping transmission of the power beam;

wherein the power receiver system comprises an energy storage device with a variable energy level and comprising the steps of ending transmission of the power beam request signal and monitoring the energy level in the storage device; wherein the step of starting transmission of the power beam request signal occurs when the energy level is below a pre-established level; and the step of ending transmission of the power beam request signal occurs when the energy level is at or above the pre-established level.

39. A method for transmitting a wireless power beam to a power receiver system having an energy receptor comprising:

starting transmission of a power beam request signal wherein the power beam request signal comprises a data stream;

receiving the power beam request signal at a first power transmission unit;

starting transmission of the wireless power beam from a first power transmission unit to the energy receptor in response to receiving the power beam request signal;

stopping transmission of the power beam; and losing the power beam request signal at the first power transmission unit wherein the step of stopping transmission of the power beam is a function of the loss of the power beam request signal.

40. A method for transmitting a wireless power beam to a power receiver system having an energy receptor comprising:

starting transmission of a power beam request signal;

receiving the power beam request signal at a first power transmission unit;

starting transmission of the wireless power beam from a first power transmission unit to the energy receptor in response to receiving the power beam request signal;

stopping transmission of the power beam; and maintaining transmission of energy as a wireless power beam from the power transmission unit to the energy receptor only as long as the power beam request signal is received by the power transmission unit.

41. A method for transmitting a wireless power beam to a power receiver system having an energy receptor comprising:

starting transmission of a power beam request signal;

receiving the power beam request signal at a first power transmission unit;

starting transmission of the wireless power beam from a first power transmission unit to the energy receptor in response to receiving the power beam request signal;

stopping transmission of the power beam after a predetermined amount of energy has been transmitted;

acknowledging receipt of the predetermined amount of energy by the power receiver system to the power transmission unit; and starting transmission of the power beam for a subsequent predetermined amount of energy after the step of acknowledging.

42. A method for transmitting a wireless power beam to a power receiver system having an energy receptor comprising:

starting transmission of a power beam request signal;

receiving the power beam request signal at a first power transmission unit;

starting transmission of the wireless power beam from a first power transmission unit to the energy receptor in response to receiving the power beam request signal; and stopping transmission of the power beam; wherein the wireless power beam is in the form of discrete energy pulses each containing a predetermined amount of energy.

43. A method for transmitting a wireless power beam to a power receiver system having an energy receptor comprising:

starting transmission of a power beam request signal;

receiving the power beam request signal at a first power transmission unit;

starting transmission of the wireless power beam from a first power transmission unit to the energy receptor in response to receiving the power beam request signal; and stopping transmission of the power beam; wherein the wireless power beam is in the form of discrete energy pulses each containing a predetermined amount of energy and the power beam request signal comprises an acknowledgment of receipt of the predetermined amount of energy at the energy receptor and comprising the step of stopping transmission of the power beam in response to a failure to acknowledge receipt of the power beam.

44. A method for transmitting a wireless power beam to a power receiver system having an energy receptor comprising:

starting transmission of a power beam request signal;

receiving the power beam request signal at a first power transmission unit;

starting transmission of the wireless power beam from a first power transmission unit to the energy receptor in response to receiving the power beam request signal;

stopping transmission of the power beam;

transmitting a power unit communication signal from the power transmission unit;

receiving the power unit communication signal at the power receiver system;

establishing a two way communication link between the power transmission unit and the power receiver system; and stopping transmission of the power beam in response to a loss of the two-way communication link.

45. A method for transmitting a wireless power beam to a power receiver system having an energy receptor comprising:

starting transmission of a power beam request signal;

receiving the power beam request signal at a first power transmission unit;

starting transmission of the wireless power beam from a first power transmission unit to the energy receptor in response to receiving the power beam request signal; and stopping transmission of the power beam; wherein the power receiver system is moving and comprising the step of tracking a location of the moving power beam request signal.

46. A method of transmitting a wireless power beam to a power receiver system having an energy receptor comprising:
- starting transmission of the wireless power beam from a first power transmission unit to the energy receptor;
- stopping transmission of the power beam after a predetermined amount of energy has been transmitted;
- acknowledging the receipt of the predetermined amount of energy by the power receiver system to the power transmission unit; and
- starting transmission of the power beam for a subsequent predetermined amount of energy after the step of acknowledging.

47. A method for transmitting a wireless power beam to a power receiver system having an energy receptor comprising:
- starting transmission of a power beam request signal;
- receiving the power beam request signal at a first power transmission unit;
- transmitting a power unit communication signal from the power transmission unit;
- receiving the power unit communication signal at the power receiver system;
- establishing a two way communication link between the power transmission unit and the power receiver system;
- starting transmission of the wireless power beam from a first power transmission unit to the energy receptor in response to receiving the power beam request signal; and
- stopping transmission of the power beam in response to a loss of the two-way communication link.

48. A remote power system comprising:
- an energy source;
- a power transmission unit operably connected to the energy source comprising:
  - power unit communication means for receiving a power beam request signal,
  - power unit transmitter means selectively activatable between off and on conditions for transmitting energy as a wireless power beam in the on condition,
  - power unit controller means operably connected to the power unit communication means and the power unit transmitter means for activating the power unit transmitter means from the off condition to the on condition after the power transmission unit receives the power beam request signal; and a first power receiver system comprising:
    - energy receptor means for receiving the wireless power beam,
    - energy conversion means for transforming energy in the received wireless power beam to a usable energy form, and
    - translocator means for transmitting the power beam request signal as a function of a demand for energy, wherein the translocator means alternates between transmission of the power beam request signal in a single direction and transmission of the power beam request signal in a plurality of directions.

* * * * *

UNITED STATES PATENT AND TRADEMARK OFFICE
CERTIFICATE OF CORRECTION

PATENT NO.   : 6,792,259 B1
DATED        : September 14, 2004
INVENTOR(S)  : Parise It is certified that error appears in the above-identified patent and that said Letters Patent is hereby corrected as shown below:

Column 29,
Line 3, delete "sower" and insert -- power --.

Signed and Sealed this

Thirty-first Day of January, 2006

JON W. DUDAS
*Director of the United States Patent and Trademark Office*